US011805347B2

(12) United States Patent
Evans et al.

(10) Patent No.: US 11,805,347 B2
(45) Date of Patent: *Oct. 31, 2023

(54) DISPLAY SYSTEM HAVING AN AUDIO OUTPUT DEVICE

(71) Applicant: Apple Inc., Cupertino, CA (US)

(72) Inventors: Neal D. Evans, Sunnyvale, CA (US); James W. VanDyke, Sunnyvale, CA (US); Andrew M. Hulva, San Jose, CA (US); Robert D. Silfvast, Belmont, CA (US); Christopher T. Eubank, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/951,103

(22) Filed: Nov. 18, 2020

(65) Prior Publication Data
US 2021/0076120 A1 Mar. 11, 2021

Related U.S. Application Data

(63) Continuation of application No. 16/144,528, filed on Sep. 27, 2018, now Pat. No. 10,848,846.
(Continued)

(51) Int. Cl.
H04R 1/10 (2006.01)
G02B 27/01 (2006.01)
(Continued)

(52) U.S. Cl.
CPC ......... H04R 1/1008 (2013.01); G02B 27/017 (2013.01); H03G 5/025 (2013.01); H04R 5/02 (2013.01); H04R 5/0335 (2013.01)

(58) Field of Classification Search
CPC ........ H04R 25/00; H04R 25/60; H04R 25/65; H04R 2225/023; H04R 2225/025; H04R 1/10; H04R 1/105
See application file for complete search history.

(56) References Cited

U.S. PATENT DOCUMENTS 5,633,993 A 5/1997 Redmann et al.
7,155,025 B1 12/2006 Weffer
(Continued)

FOREIGN PATENT DOCUMENTS

CN 102891657 A 1/2013
CN 105049977 A 11/2015
(Continued)

OTHER PUBLICATIONS

Noronha, Evan, "Oculus Rift CV1 Teardown", Teardown of the Oculus Rift CV1 (Consumer Version 1) performed on Mar. 29, 2016, https://www.ifixit.com/Teardown/Oculus+Rift+CV1+Teardown/60612, (20 pp).
(Continued)

Primary Examiner — Suhan Ni
(74) Attorney, Agent, or Firm — Young Basile Hanlon & MacFarlane, P.C.

(57) ABSTRACT

A display system includes a head-mounted display unit and a detachable speaker unit. The head-mounted display unit outputs visual content to a user and provides a visual pass-through of a real environment to the user. The detachable speaker unit is detachably coupleable to the head-mounted display unit for providing aural content to the user. At least one of the visual content or the aural content is changed according to a position of the detachable speaker unit relative to the head-mounted display unit.

20 Claims, 17 Drawing Sheets

Related U.S. Application Data

(60) Provisional application No. 62/684,826, filed on Jun. 14, 2018.

(51) Int. Cl.
*H03G 5/02* (2006.01)
*H04R 5/02* (2006.01)
*H04R 5/033* (2006.01)

(56) References Cited

U.S. PATENT DOCUMENTS

| | | | |
|---|---|---|---|
| 8,259,984 B2 * | 9/2012 | van der Bilt | H04R 1/1041 |
| | | | 381/384 |
| 2002/0186180 A1 | 12/2002 | Duda | |
| 2005/0058317 A1 | 3/2005 | Montgomery | |
| 2008/0166002 A1 | 7/2008 | Amsel | |
| 2008/0279409 A1 | 11/2008 | Hupkes | |
| 2011/0214082 A1 | 9/2011 | Osterhout et al. | |
| 2014/0064536 A1 | 3/2014 | Kim et al. | |
| 2014/0118631 A1 | 5/2014 | Cho | |
| 2016/0050487 A1 | 2/2016 | Kim | |
| 2016/0100244 A1 | 4/2016 | Gentile et al. | |
| 2016/0363771 A1 | 12/2016 | Miller et al. | |
| 2017/0347219 A1 | 11/2017 | McCauley et al. | |
| 2019/0394555 A1 * | 12/2019 | Ito | H04R 5/0335 |

FOREIGN PATENT DOCUMENTS

| | | |
|---|---|---|
| CN | 105518516 A | 4/2016 |
| CN | 205158279 U | 4/2016 |
| CN | 106063290 A | 10/2016 |
| CN | 106461944 A | 2/2017 |
| CN | 107071648 A | 8/2017 |
| EP | 2624591 A1 | 8/2013 |
| EP | 2986023 A2 | 2/2016 |
| JP | 2007266870 A | 10/2007 |
| JP | 2011066549 A | 3/2011 |
| JP | 2019033426 A | 2/2019 |
| WO | 2017196294 A1 | 11/2017 |
| WO | 2019031593 A1 | 2/2019 |

OTHER PUBLICATIONS

Carbotte, Kevin, "Strap In Tight With The Vive Deluxe Audio Head Strap (Hands On)", Tom's Hardware, Virtual Reality, News, May 30, 2017, https://www.tomshardware.com/news/vive-deluxe-audio-headstrap-review,34555.html, (7 pp).

Yao, Richard, et. al., "Oculus VR Best Practices Guide", Jul. 23, 2014, XP055552215, Retrieved from the Internet: URL:http://elabweb.hpa.edu/public/brain/oculus/OculusSDK/Doc/Oculus_Best_Practices_Guide.pdf [retrieved Feb. 5, 2019], p. 6 (51 pp).

Invitation to Pay Additional Fees and, Where Applicable, Protest Fee issued in International Application No. PCT/US2018/053142 mailed Feb. 14, 2019 (14 pp).

* cited by examiner

Distance between Speaker Unit and coupling location on HMD

DISPLAY SYSTEM HAVING AN AUDIO OUTPUT DEVICE

CROSS-REFERENCE TO RELATED APPLICATION(S)

This application is a continuation of U.S. patent application Ser. No. 16/144,528, filed Sep. 27, 2018, which claims priority to and the benefit of U.S. Provisional Patent Application No. 62/684,826, filed Jun. 14, 2018, the entire disclosures of which are incorporated by reference herein.

TECHNICAL FIELD

This disclosure relates to display systems and, in particular, audio output devices therefor.

BACKGROUND

Virtual reality systems provide content to a user, which may include visual and aural content. The visual content may be provided by a head-mounted display unit (HMD), while the aural content is often provided by headphones that are physically separate from the head-mounted display unit.

SUMMARY

Disclosed herein are implementations of display systems. In one aspect, a display system includes a head-mounted display unit and a detachable speaker unit. The head-mounted display unit outputs visual content to a user and provides a visual pass-through of a real environment to the user. The detachable speaker unit is detachably coupleable to the head-mounted display unit for providing aural content to the user. At least one of the visual content or the aural content is changed according to a position of the detachable speaker unit relative to the head-mounted display unit.

The head-mount display may include a built-in speaker. Output of the aural content by one or more of the detachable speaker unit or the built-in speaker according to the position. Audio signal processing of the aural content output by the detachable speaker unit may change as the detachable speaker unit is moved toward a coupling location on the head-mounted display unit. The audio signal processing includes one or more of changing a volume, equalization, or dynamic range of the aural content output by the detachable speaker unit. When the detachable speaker unit is in a field of view of the head-mounted display unit, the visual content may include a visual indicator in spatial proximity to the detachable speaker unit. The visual indicator may indicate a sound output capability of the detachable speaker unit to the user.

In another aspect, a display system includes a head-mounted display unit and an audio headset. The head-mounted display unit includes first and second built-in speakers. The audio headset includes first and second detachable speaker units that are detachably coupleable to the head-mounted display unit.

In another aspect, a method is provided for providing content with a display system having a head-mounted display unit, a movable audio output devices that is movable relative to the head-mounted display unit, a controller, and a sensor. The method includes determining, by the controller with the sensor, a position of the movable audio output device, and providing content with the head-mounted display unit according to the position of the movable audio output device.

DETAILED DESCRIPTION

Disclosed herein are embodiments of display systems that include a head-mounted display unit and an audio output device, such as an audio headset. The audio output device is detachable from or is otherwise movable relative to the head-mounted display unit in various manners described herein. Aural content provided from the audio output device and/or a built-in audio output device may be output according to the position of the movable audio output device in various manners described herein. Visual content may also be provided according to the position of the movable audio output device in various manners described herein.

Figure 1A:
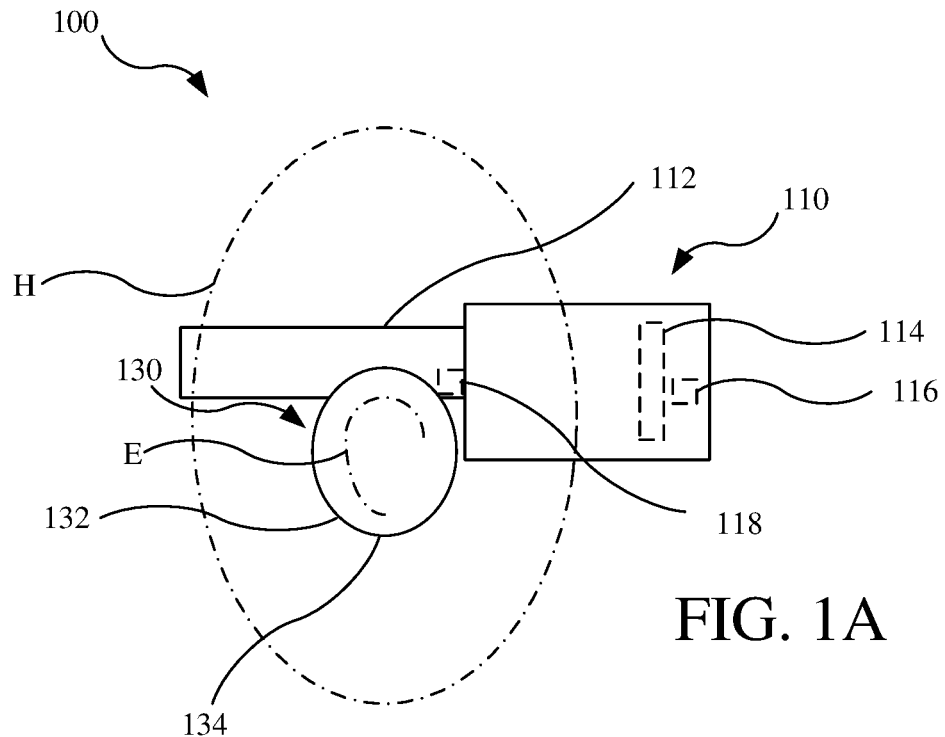
FIG. 1A is a side view of a display system.
Figure 1B:
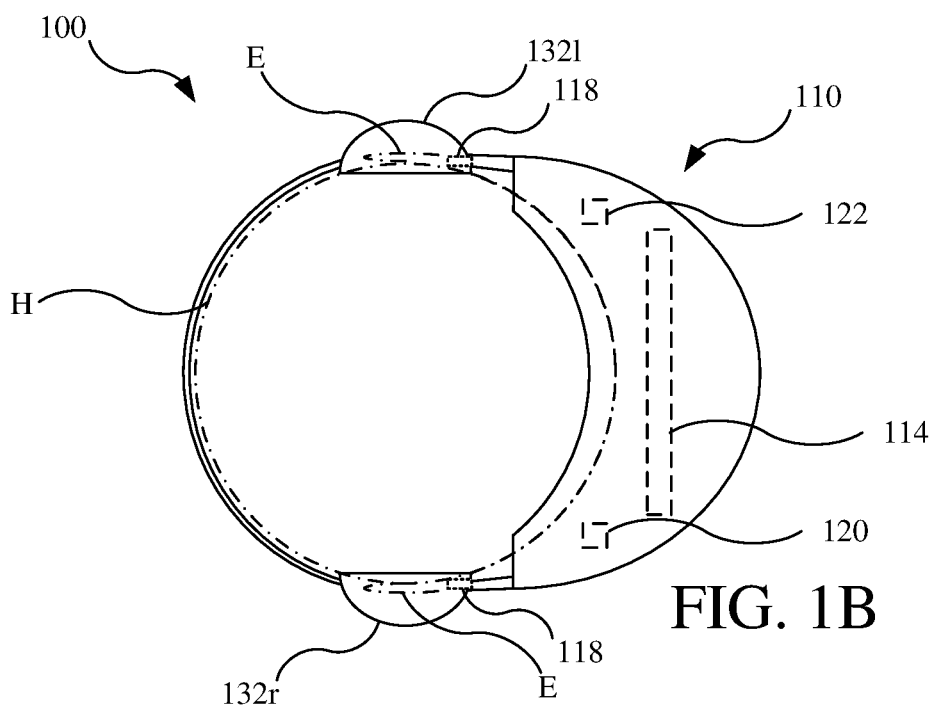
FIG. 1B is a top view of the display system of FIG. 1A.
Figure 1C:
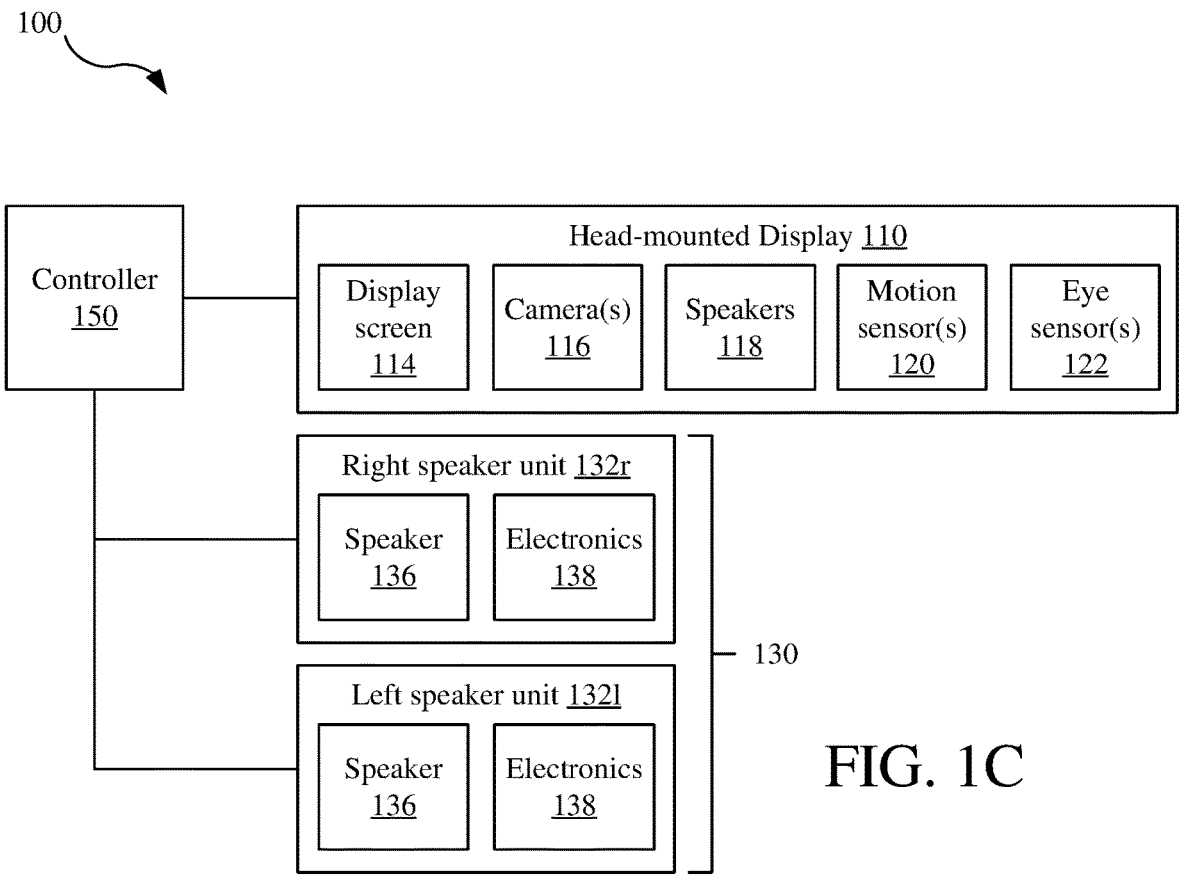
FIG. 1C is a schematic view of the display system of FIG. 1A.

Referring to FIGS. 1A-1C, a display system 100 includes a head-mounted display unit 110 and an audio headset 130 that is physically movable relative to the head-mounted display unit 110, such as being detachable therefrom (as shown) or articulating relative thereto. As discussed in further detail below, the display system 100 may form a mechanical and/or electrical connection between the head-mounted display unit 110 and the audio headset 130, may provide sound to the user by the head-mounted display unit 110 itself and the audio headset 130, and/or may provide cues and/or feedback to the user related to use of the audio headset 130 with the head-mounted display unit 110. The term "audio headset 130" refers to an audio output device or a set of audio output devices (e.g., detachable speaker units 132, as described below) to be held in close proximity to the user's ear or ears. In the case of multiple audio output devices (e.g., two), the audio output devices of the audio headset 130 may be separate or separable from each other (e.g., need not be affixed to each other, for example, with a headband extending therebetween). The audio headset 130 may also be referred to as a headphone, headphones, an earphone, or earphones.

The display systems disclosed herein may be configured to provide computer-generated reality (e.g., virtual reality or mixed reality), as described below. The term "virtual," as used generally refers to content or an experience that is "computer-generated." For example, the content described herein may be referred to as virtual or computer-generated content, such as visual content (e.g., also referred to as virtual or computer-generated visual content or graphics) and aural content (e.g., also referred to as virtual or computer-generated aural content or audio).

The head-mounted display unit 110 generally includes a support 112 and a display screen 114. The support is configured to be worn on a user's head H to thereby support the display screen 114 in a suitable position relative to eyes of the user. As shown, the support is configured as a strap that surrounds the head H of the user. The display screen 114, such as the screen of a smartphone or a dedicated screen, provides the visual content to the user. In the case of the display screen 114 being a smartphone or other video output device that is removable, the head-mounted display unit 110 may be considered coupleable to the display screen 114.

The display system 100 may be configured to provide a mixed reality experience by providing a visual pass-through by which the user may view the real environment. As shown, the head-mounted display unit 110 utilizes a video pass-through in which case one or more cameras 116 of the head-mounted display unit 110 capture images of the real environment, which are displayed by the display screen 114 to the user. Such a display system 100 may also function to provide a virtual reality experience in which case images of the real environment are not displayed by the display screen 114 and the real environment is otherwise partially or wholly blocked from the view of the user. As an alternative to video pass-through, the head-mounted display unit 110 may utilize an optical pass-through in which case the user views the real environment directly. For example, the head-mounted display unit 110 may include a reflector that both permits light from the real environment to pass therethrough to eyes of the user and reflects light from the display screen 114 to eyes of the user to provide the visual content.

The head-mounted display unit 110 may additionally include speakers 118, which transmit or output aural content to ears of the user. The speakers 118 are, for example, coupled to the support 112 in proximity to ears E of the user and direct sound thereto. The speakers 118 are fixedly coupled to the head-mounted display unit 110 (e.g., to the support 112 or a housing of the display screen 114), so as to not be easily removable therefrom. This stands in contrast to the speaker units 132 of the audio headset 130, which are detachably coupleable to the head-mounted display unit 110, so as to be easily removable therefrom. As such, the speakers 118 may be referred to as fixed audio output devices, fixed speakers, built-in speakers, or HMD speakers, while the speaker units 132 may be referred to as detachable speakers or detachable speaker units. The audio headset 130 and the detachable speaker units 132 may also be referred to as audio output devices or movable audio output devices.

The HMD speakers 118 additionally permit sound from the real environment to reach the ears of the user. For example, the HMD speakers 118 may be positioned above and/or in front of the ears of the user, thereby not obstructing sound from the real environment from reaching the ears of the user. Thus, the head-mounted display unit 110 may provide the mixed reality experience aurally to the user by allowing the user to hear the real environment, while simultaneously transmitting the aural content to the user. As such, the HMD speakers 118 may also be referred to as extra-aural speakers.

As discussed in further detail below, the HMD speakers 118 are additionally configured to allow the audio headset 130 to provide the aural content to the user in conjunction with or exclusive of the HMD speakers 118. In some embodiments, the HMD speakers 118 may be omitted in which case the aural content is provided by the audio headset 130.

The head-mounted display unit may also include various sensors that detect conditions pertaining to the user, the head-mounted display unit 110, and/or the audio headset 130. For example, in addition to the camera 116, the head-mounted display unit 110 may include motion sensors 120, such one or more of accelerometers, gyroscopes, magnetometers, inertial measurement units (IMU), cameras, or the like, which measure conditions pertaining to the position and/or orientation of the head H of the user and/or the head-mounted display unit 110. The camera 116 and/or motion sensors 120 may also be configured to determine the position, orientation, and/or motion of the audio headset 130 relative thereto, for example, using visual recognition of the audio headset 130, being configured to detect, locate, and/or track markers of the detachable speaker unit 132, and/or being configured to detect, locate, and/or track beacon signals emitted from the detachable speaker unit 132. The head-mounted display unit 110 may also include eye sensors 122, such as cameras, which are used to measure conditions of the user's eye (e.g., focal distance, pupil size, etc.).

The audio headset 130 includes the detachable speaker units 132, which provide aural content to the user by transmitting sound to the ears E of the user. The detachable speaker units 132, for example, include a right detachable speaker unit 132r and a left detachable speaker unit 132l, which are to be physically associated with a right ear E and a left ear E, respectively, of the user for providing the aural content thereto.

Each of the detachable speaker units 132 generally includes a housing 134, as well as one or more speakers 136 and electronics 138 of various types. The housing 134 contains the one or more speakers 136 and the electronics 138, and is configured to connect to the support 112 of the head-mounted display unit 110 to be supported thereby, receive audio signals therefrom, and/or receive electric power therefrom. The speaker 136 outputs the sound (i.e., of the aural content) to the user. The electronics 138 are cooperatively configured with the speaker 136 to provide the sound output, and may provide other functionality.

As illustrated, the audio headset 130 may have an over-ear configuration in which case the housing 134 is configured to surround an entirety of the ear of the user. Alternatively, the audio headset 130 may have an on-ear configuration in which case the housing 134 is configured to rest on the ear of the user, or have an in-ear configuration in which a portion of the housing 134 is positioned in the ear E (e.g., partially in the ear canal) of the user.

Figure 1D:
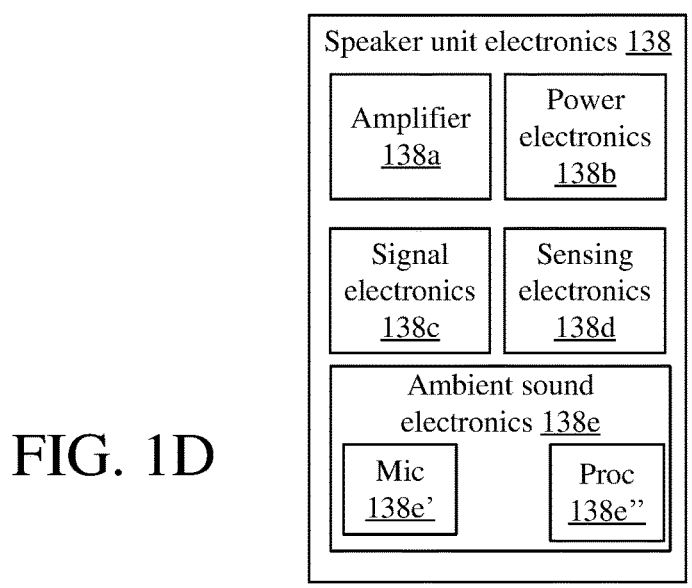
FIG. 1D is a schematic view of a detachable speaker unit of the display system of FIG. 1A.

As shown schematically in FIG. 1D, the electronics 138 of the speaker unit 132 may include an amplifier 138*a*, power electronics 138*b*, signal electronics 138*c*, sensing electronics 138*d*, and/or ambient sound electronics 138*e*. The amplifier 138*a* is configured to drive the speaker 136 for outputting the sound. The power electronics 138*b* are configured to power the various other electronics of the detachable speaker unit 132, such as the amplifier 138*a*, the signal electronics 138*c*, and/or the sensing electronics 138*d*. The power electronics 138*b* may, for example, provide for wired power and/or locally stored power, such as with a battery. The signal electronics 138*c* are configured to receive and/or send signals to and/or from the head-mounted display unit 110 or another component, such as a controller 150 discussed below. The signal electronics 138*c* may, for example, include communications interfaces to send and/or receive signals, such as via wireless, conductive, or optical connections. Such signals may, for example, include audio signals received for outputting the aural content from the detachable speaker unit 132 and/or sensing signals for providing sensing information of the detachable speaker unit 132 (e.g., position). The signal electronics 138*c* may also provide outputs to assist determining the position and/or orientation of the detachable speaker unit 132 relative to the head-mounted display unit 110, for example, by providing a passive or active marker (e.g., visible or invisible light source) or a beacon (e.g., emitting another type of detectable and locatable output signal). The sensing electronics 138*d* are configured to sense various parameters of the detachable speaker unit 132, such as a position, orientation, and/or motion (e.g., changes in position and orientation) of the detachable speaker unit 132 in real space or relative to another part of the display system 100, such as the head-mounted display unit 110, the support 112 thereof, or coupling locations or features thereon. The sensing electronics 138*d* may include one or more appropriate sensors for detecting such position, orientation, and/or motion, such as accelerometer(s), gyroscope(s), inertial measurement unit (IMU), proximity sensor(s), and/or cameras (e.g., for video recognition).

The ambient sound electronics 138*e* function to detect ambient sounds (e.g., from the real environment using a microphone 138*e'*), process the detected ambient sounds (e.g., with a signal processor 138*e"*), and cause the speaker 136 to output a processed sound according thereto (e.g., using the amplifier 138*a*). The processed sound may, for example, provide acoustic transparency and/or active noise canceling. With acoustic transparency, the ambient sound from the real environment is generally reproduced without significant alteration as the processed sound, which may be referred to as processed ambient sound and is output by the speaker 136. As a result, the user may still hear the real environment, for example, when the detachable speaker unit 132 is placed against the user's ear E and might otherwise hinder (e.g., by insulating and/or blocking) the ambient sound of the real environment from reaching the user's ear E directly. With active noise canceling, the ambient sound is processed to provide processed sound that generally cancels or counters the ambient sound (e.g., by having the same amplitude but inverted phase as the ambient sound), which may be referred to as the processed canceling sound and is output by the speaker 136.

It should be noted that the speaker electronics 138 (e.g., the amplifier 138*a*, the power electronics 138*b*, the signal electronics 138*c*, the sensing electronics 138*d*, and/or the ambient sound electronics 138*e*), or different electronics performing similar functions, may instead or additionally be incorporated into the head-mounted display unit 110. For example, the speaker 136 may have a wired connection to the head-mounted display unit 110 and/or the controller 150, while amplification, power, sensing, and ambient sounds functions are performed by electronics of the head-mounted display unit 110 and/or the controller 150.

In addition to the head-mounted display unit 110 and the audio headset 130, the display system 100 additionally includes the controller 150. As illustrated, the controller 150 may be external to the head-mounted display unit 110 and the audio headset 130 and is in communication therewith, such as with a wired or wireless connection. The controller 150 is generally configured to process various input information (e.g., signals), such as the location and/or orientation of the user, the head-mounted display unit 110, and/or the audio headset 130, process such information, and provide output signals for controlling the head-mounted display unit 110 (e.g., to output the visual content and the aural content) and the audio headset 130 (e.g., to output the aural content). A hardware configuration for the controller 150 is discussed below with reference to FIG. 9. While depicted as a singular unit separate from and external to the head-mounted display unit 110 and the audio headset 130, the controller 150 may instead include multiple such controllers or be subdivided into separate units that cooperatively function as the controller 150, and the controller 150 may be incorporated into one or more of the head-mounted display unit 110 and the detachable speaker units 132.

As referenced above, the head-mounted display unit 110 and the audio headset 130 may be cooperatively configured provide mechanical, electrical, and/or data connections between the head-mounted display unit 110 and the audio headset 130, cooperatively provide sound to the user, and/or provide cues and/or feedback to the user related to use of the audio headset 130 with the head-mounted display unit 110.

Referring to FIGS. 2A-4B, each of the detachable speaker units 132 of the audio headset 130 is detachable from the head-mounted display unit 110. When attached to the head-mounted display unit 110, each of the detachable speaker units 132 is physically supported thereby, and may further be in communication therewith and/or receive electric power therefrom.

Figure 2A:
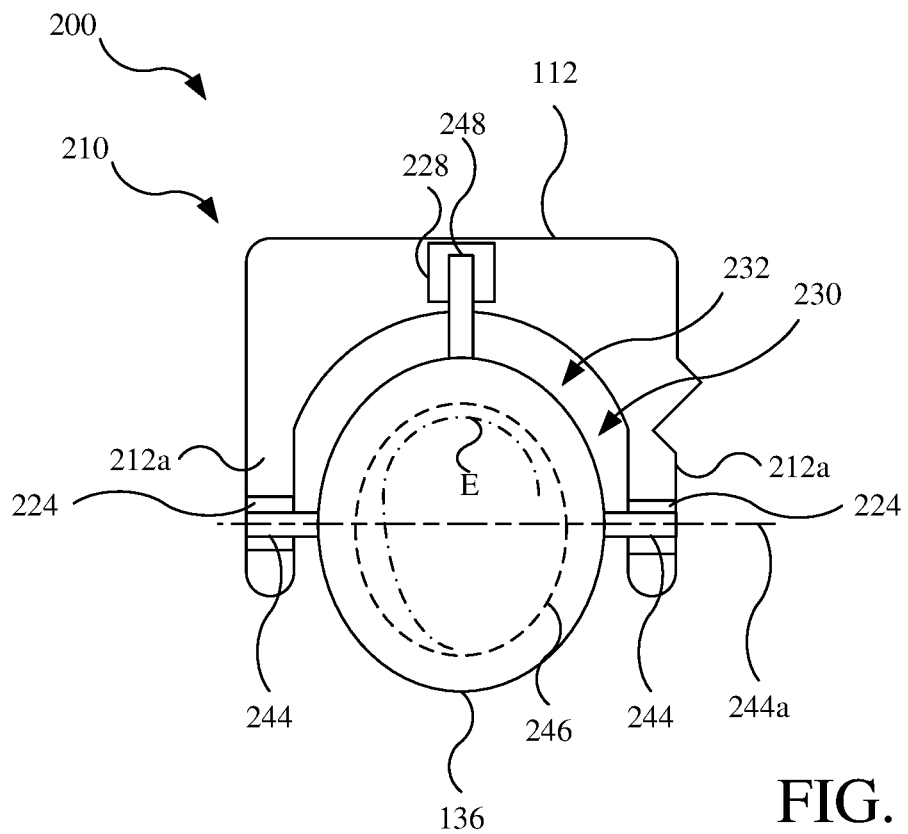
FIG. 2A is a partial side view of another display system that is a variation of the display system of FIG. 1.
Figure 2B:
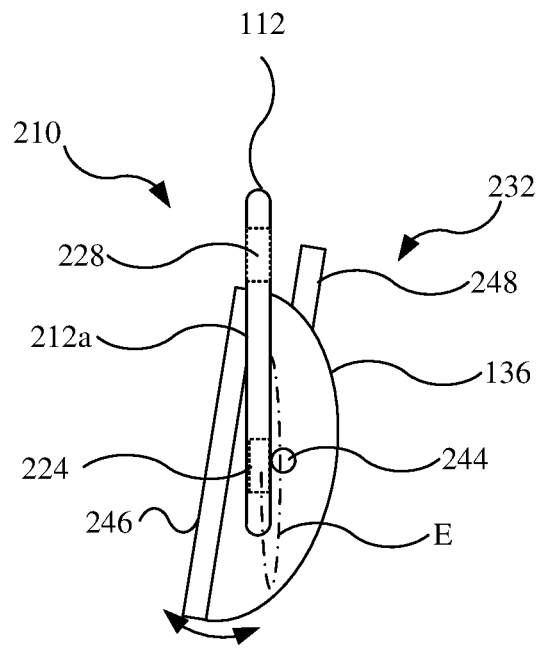
FIG. 2B is a partial rear view of the display system of FIG. 2A.

Referring to FIGS. 2A-2B, a display system 200 includes an audio headset 230 having detachable speaker units 232 that are releasably coupleable to a head-mounted display unit 210 with magnetic force. The head-mounted display unit 210 is configured as the head-mounted display unit 110, while additionally including one or more magnetic attachments 224, which may be referred to as HMD magnetic attachments. The detachable speaker unit 232 is configured as the detachable speaker unit 132, while including one or more magnetic attachments 244 that correspond to the HMD magnetic attachments 224 of the head-mounted display unit 210. The magnetic attachments 224, 244 of the head-mounted display unit 210 and the detachable speaker unit 232 may be referred to as HMD magnetic attachments 224 and speaker magnetic attachments 244, respectively. The magnetic attachments 224, 244 are configured to attract each other with magnetic force, for example, with one of the magnetic attachments 224, 244 including a permanent magnetic and the other including ferromagnetic material or another permanent magnet of opposite orientation.

In the example shown in FIGS. 2A-2B, the head-mounted display unit 210 includes two HMD magnetic attachments 224, one being forward of and the other being rearward of the ear E of the user. As shown, the two HMD magnetic attachments 224 may be coupled to the support 112 of the head-mounted display unit 210, for example, to flanges 212a (e.g., protrusions) that extend downward to positions forward and rearward of the ear E of the user. The two HMD magnetic attachments 224 include permanent magnets, which may be incorporated into or otherwise coupled to the support 112 of the head-mounted display unit 210.

The detachable speaker unit 232, such as the housing 134 or padding 246 thereof, may protrude (e.g., extend inward) of the support 112 (e.g., inward of the flanges 212a) to be positioned against the user, for example, engaging the head H around the ear E (e.g., over ear configuration) or engaging the ear E of the user (e.g., on ear configuration). As a result, the detachable speaker unit 232 may be considered to have an inner portion (e.g., the padding 246 and/or the housing 134) that extends laterally inward (e.g., toward the user) from an outer portion (e.g., formed by the speaker magnetic attachments 244) that is coupled to the head-mounted display unit 110. The padding 246 may engage and/or circumscribe the ear E of the user (e.g., in an on ear and/or over ear configuration).

Each of the detachable speaker units 232 includes the two speaker magnetic attachments 244, which are magnetically coupleable to the two HMD magnetic attachments 224 of the head-mounted display unit 210. For example, the two speaker magnetic attachments 244 may extend forward and rearward of the ear E of the user, so as to be magnetically coupleable to the HMD magnetic attachments 224. The speaker magnetic attachments 244 may, for example, be elongated and extend forward and rearward from the housing 134 of the detachable speaker unit 232. As shown, the speaker magnetic attachments 244 may be configured as posts that include the ferromagnetic material or permanent magnets of opposite orientation for being attracted to the permanent magnets of the HMD magnetic attachments 224 of the head-mounted display unit 210. Alternatively, the HMD magnetic attachments 224 may include ferromagnetic material, while the speaker magnetic attachments 244 include permanent magnets to be attracted thereto.

The head-mounted display unit 210 and the detachable speaker unit 232 may also be configured to guide the detachable speaker units 232 to a pre-determined position relative thereto (e.g., a coupling location of the head-mounted display unit 110 over the ear E of the user). For example, each set of the magnetic attachments 224, 244 (e.g., front and rear pairs of the magnetic attachments 224, 244) provide magnetic force to guide the speaker magnetic attachments 244 of the detachable speaker unit 232 to the HMD magnetic attachment 224 of the head-mounted display unit 210 corresponding. Additionally, the magnetic attachments 224, 244 that do not correspond to each other may also function to repel each other, for example, by having permanent magnets with the same orientation. As a result, the detachable speaker unit 232 is pushed away from non-predetermined positions. These attraction and/or repulsion forces may be useful to help the user guide the detachable speaker units 132 to their respective coupling locations on the head-mounted display unit 210, which are outside the user's field of view, by providing tactile feedback to the user.

Instead of or in addition to using magnetic force to guide the detachable speaker units 232 to proper positions, the head-mounted display unit 210 and the detachable speaker unit 232 may include mechanically cooperative guide features. For example, the head-mounted display unit 210 may include detents in the support 112, which receive and guide the speaker magnetic attachments 244 of the detachable speaker unit 232 to the predetermined location.

The detachable speaker unit 232 may be configured to pivot about the speaker magnetic attachments 244, for example, to be biased toward or otherwise accommodate the ear E of the user. In one example, the speaker magnetic attachments 244 are cylindrical posts that extend forward and rearward (e.g., forming a pivot axis 244a). The cylindrical posts roll along surfaces of the HMD magnetic attachments 224 or the support 112 of the head-mounted display unit 210, so as to pivot relative thereto. In another example, the housing 134 pivots relative to the speaker magnetic attachments 244 without the speaker magnetic attachments moving (e.g., without rolling) relative to the HMD magnetic attachments 224 of the head-mounted display unit 210, thereby still allowing the housing 134 and the speaker 136 therein to pivot relative to the head-mounted display unit 210.

The pivot axis 244a of the detachable speaker unit 232 is, for example, formed by the speaker magnetic attachments 244. The pivot axis 244a may, as shown, be arranged in a central position of the detachable speaker unit 232 (e.g., horizontally and vertically), or may be biased vertically (e.g., toward an upper end of the detachable speaker unit 232) and/or horizontally (e.g., toward an inner or outer side of the detachable speaker unit 232). Additionally, the pivot axis 244a may, as shown, be arranged outward of the support 112 of the head-mounted display unit 210.

The detachable speaker unit 232 may additionally be configured to biased toward the ear E of the user about the pivot axis 244a, such as with a spring or magnets. In the example shown in FIGS. 2A-2B, the detachable speaker unit 232 may be biased toward the ear E of the user with magnetic force. The head-mounted display unit 210 may include a magnet 228 of one orientation positioned above the ear E of the user, while the detachable speaker unit 232 includes another magnet 248 of opposite orientation above the ear E of the user, for example, by forming or being incorporated in an elongated member extending upward from the housing 134. The magnets 228, 248 of the head-mounted display unit 210 and the detachable speaker unit 232 repel each other, so as to bias the detachable speaker unit 232 about the pivot axis 244a and toward the ear E of the user.

The head-mounted display unit 210 and the detachable speaker unit 232 are additionally configured for the head-mounted display unit 210 to provide electric power to the detachable speaker unit 232. As shown, the magnetic attachments 224, 244 conduct electricity from the head-mounted display unit 210 to the detachable speaker unit 232, so as to provide power to the amplifier 138a and other electronics (e.g., the signal electronics 138c and/or the sensing electronics 138d). For example, a first set of the magnetic attachments 224, 244 are for power (positive) and a second set of the magnetic attachments 224, 244 are for ground. The magnetic attachments 224, 244 may also transmit audio signals via conduction from the head-mounted display unit 210 to the detachable speaker unit 232 in conjunction with conducting electric power.

Alternatively, electric power may be conducted from the head-mounted display unit 210 to the detachable speaker unit 232 with electrical contacts that are independent of the magnetic attachments 224, 244, which may also transmit audio signals. In other variations, audio signals may be transmitted independent of the electric power, such as with separate contacts and/or an optical connection. In embodiments of the detachable speaker units 232 having the sensing electronics 138d, sensor signals may be transmitted from the detachable speaker unit 232 to the head-mounted display unit 210 with the magnetic attachments 224, 244, the separate contacts, the optical connection, or wirelessly. Electrical power may also be provided from the head-mounted display unit 210 inductively.

Referring to FIGS. 3A-3E, a display system 300 includes an audio headset 330 having a detachable speaker unit 332 that is releasably coupleable to a head-mounted display unit 310. The head-mounted display unit 310 is configured as the head-mounted display unit 110, and additionally includes a magnetic attachment 324 having a female configuration, such as a socket. The detachable speaker unit 332 is configured as the detachable speaker unit 132, while additionally including a magnetic attachment 344 having a male configuration, such as a ball, which is received by the magnetic attachment 324 of the head-mounted display unit 310. The magnetic attachments 324, 344 of the head-mounted display unit 310 and the detachable speaker unit 332 may be referred to as an HMD or female magnetic attachment, and a speaker or male magnetic attachment, respectively.

In the example shown in FIGS. 3A-3E, the head-mounted display unit 310 includes one HMD magnetic attachment 324 positioned above the ear E of the user. As shown, the HMD magnetic attachment 324 is coupled to the support 112 of the head-mounted display unit 310 above the ear E of the user. The speaker magnetic attachment 344 is coupled to the housing 134 of detachable speaker unit 332, for example, being formed at the end of an elongated protrusion (e.g., shaft) extending upward from the housing 134.

The magnetic attachments 324, 344 have complementary profiles that allow receipt of the speaker magnetic attachment 344 by the HMD magnetic attachment 324, such as a spherical shape. The magnetic attachments 324, 344 may also be configured to permit movement of the detachable speaker unit 332 relative to the head-mounted display unit 310, while still being supported thereby. For example, the detachable speaker unit 332 may be permitted to displace inward and outward, forward and backward, and rotate, as illustrated by the arrows in FIGS. 3A and 3B.

The head-mounted display unit 310 and the detachable speaker unit 332 are additionally configured for the head-mounted display unit 310 to provide electric power to the detachable speaker unit 332. As shown, the magnetic attachments 324, 344 conduct electricity from the head-mounted display unit 310 to the detachable speaker unit 332, so as to provide power to the amplifier 138a and/or other electronics 138 thereof. For example, each of the magnetic attachments 324, 344 are subdivided to provide power and ground contacts, which maintain physical contact for conducting electricity as the detachable speaker unit 332 moves relative to the head-mounted display unit 310.

Figure 3A:
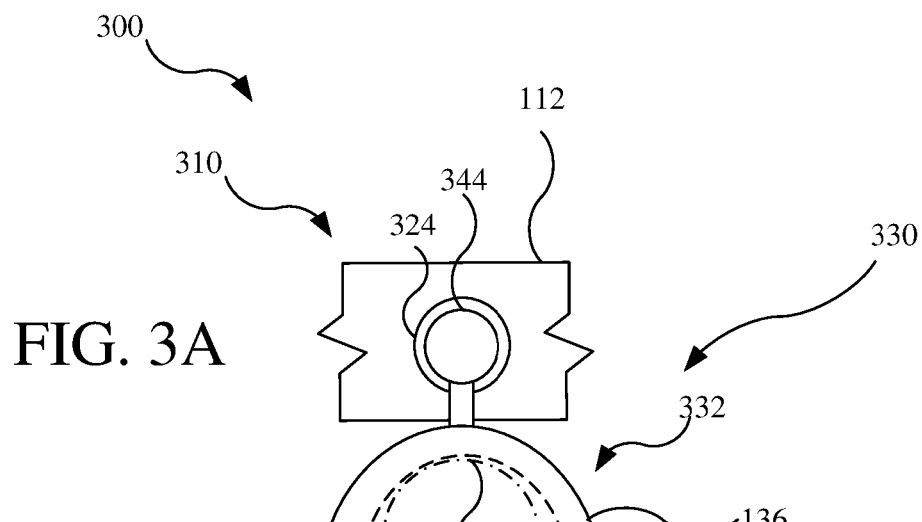
FIG. 3A is a partial side view of another display system that is a variation of the display system of FIG. 1.
Figure 3B:
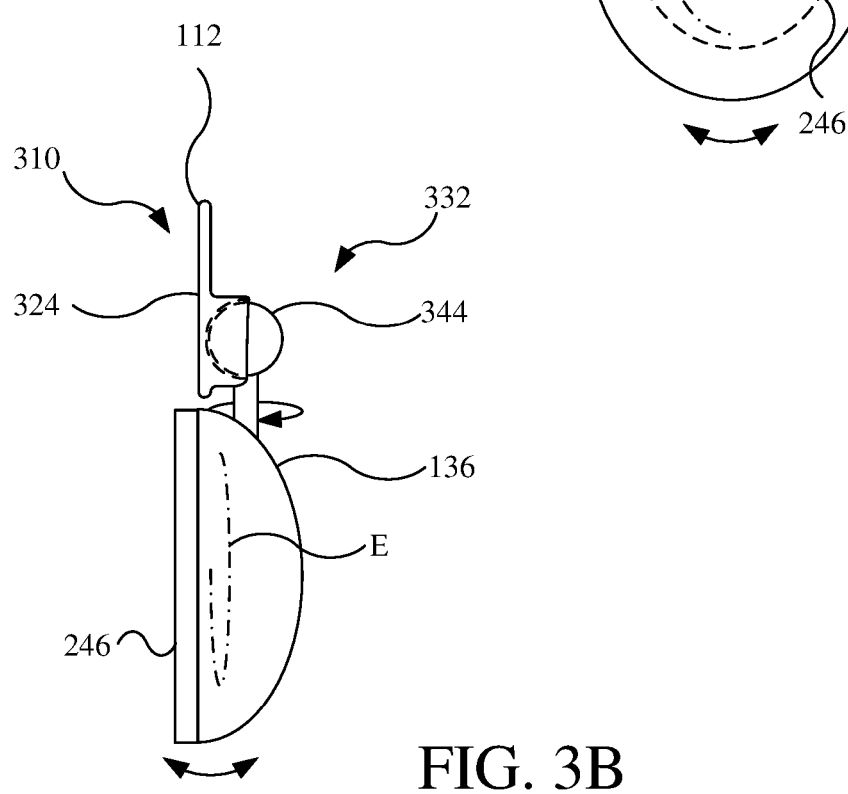
FIG. 3B is a partial rear view of the display system of FIG. 3A.
Figure 3C:
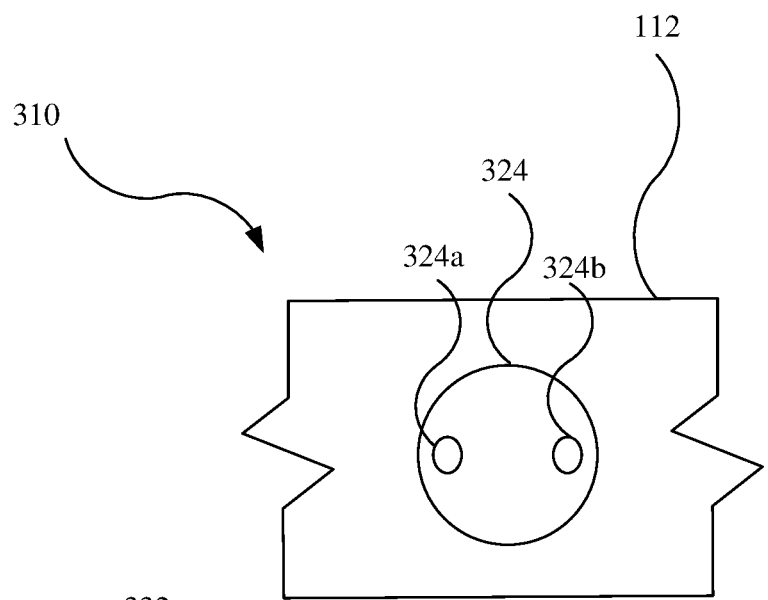
FIG. 3C is a partial side view of a head-mounted display unit of the display system of FIG. 3A.
Figure 3D:
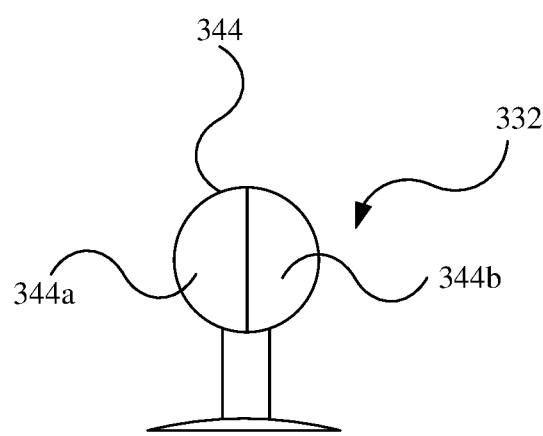
FIG. 3D is a partial side view of a detachable speaker unit of the display system of FIG. 3A.
Figure 3E:
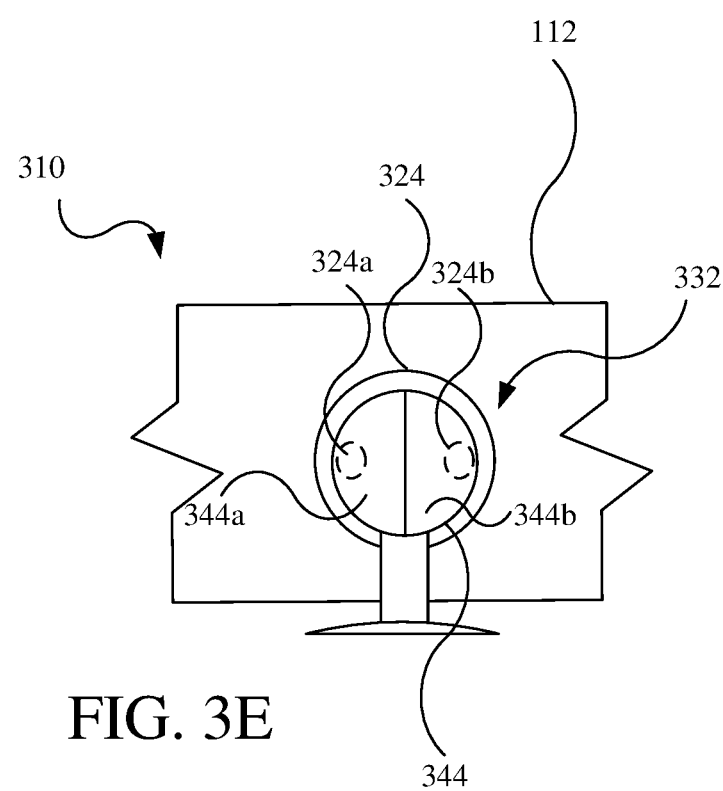
FIG. 3E is a partial side view of the display system of FIG. 3A with hidden features illustrated in dashed lines.

For example, as shown in FIG. 3C, the HMD magnetic attachment 324 may include a first power contact 324a (e.g., positive) and a second power contact 324b (e.g., ground) that are spaced apart along the spherical surface of the HMD magnetic attachment 324 and are electrically isolated from each other. As shown in FIG. 3D, the speaker magnetic attachment 344 is includes a first power contact 344a (e.g., positive) and a second power contact 344b (e.g., ground), which are electrically isolated from each other and have larger conductive surface areas than the first power contact 324a and the second power contact 324b of the HMD magnetic attachment 324 corresponding there to. As a result, as shown in FIG. 3E, the detachable speaker unit 332 may move inward/outward, forward/backward, and/or rotate in limited ranges of motion, while still maintaining conductive contact between the power contacts 344a, 344b and 324a, 324b to conduct electric power therebetween. The magnetic attachments 324, 344 may also transmit audio signals from the head-mounted display unit 310 to the detachable speaker unit 332 in conjunction with conducting electric power. The power contacts 324a, 324b of the HMD magnetic attachment 324 may, for example, be permanent magnets or be made of or otherwise include ferromagnetic material, while the power contacts 344a, 344b of the speaker magnetic attachment 344 may be made of a ferromagnetic material or be permanent magnets of opposite orientation from those of the HMD magnetic attachment 324.

While the detachable speaker units 232, 332 are discussed as being movable relative to the head-mounted display units 210, 310, variations of the magnetic attachments 224, 244 and the magnetic attachments 324, 344 may instead be configured to prevent movement therebetween.

Further, while the detachable speaker units 232, 332 are discussed as being releasably coupleable to the head-mounted display units 210, 310 with magnetic force, they may instead be coupled to each other with other releasable mechanisms, such as buckles, clamps, or fasteners. In such cases, power and signals may be conducted through such releasable mechanisms or separate power connections and data connections.

Figure 4A:
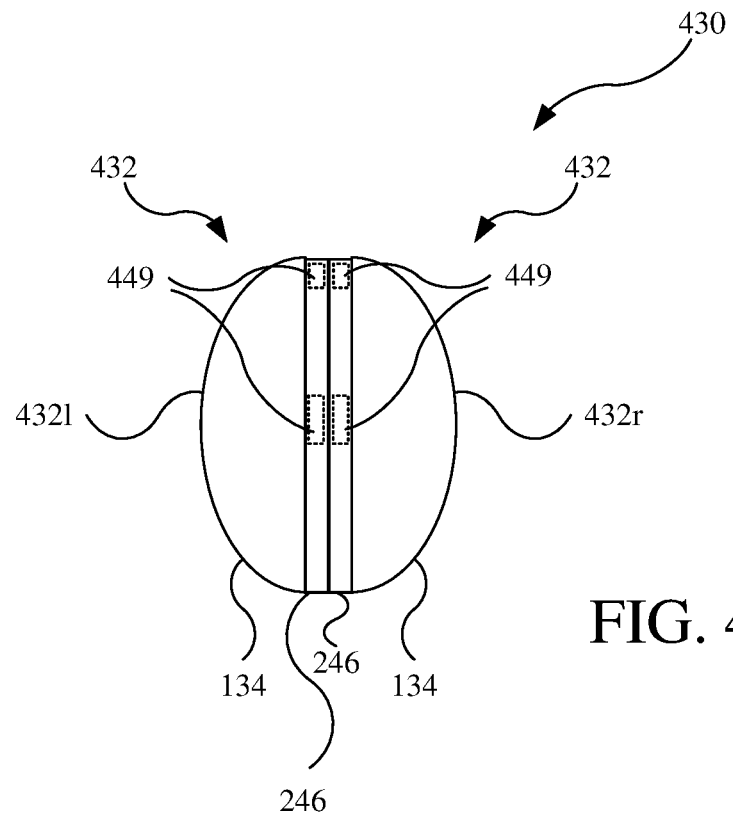
FIG. 4A is a first view of an audio headset in a first state.
Figure 4B:
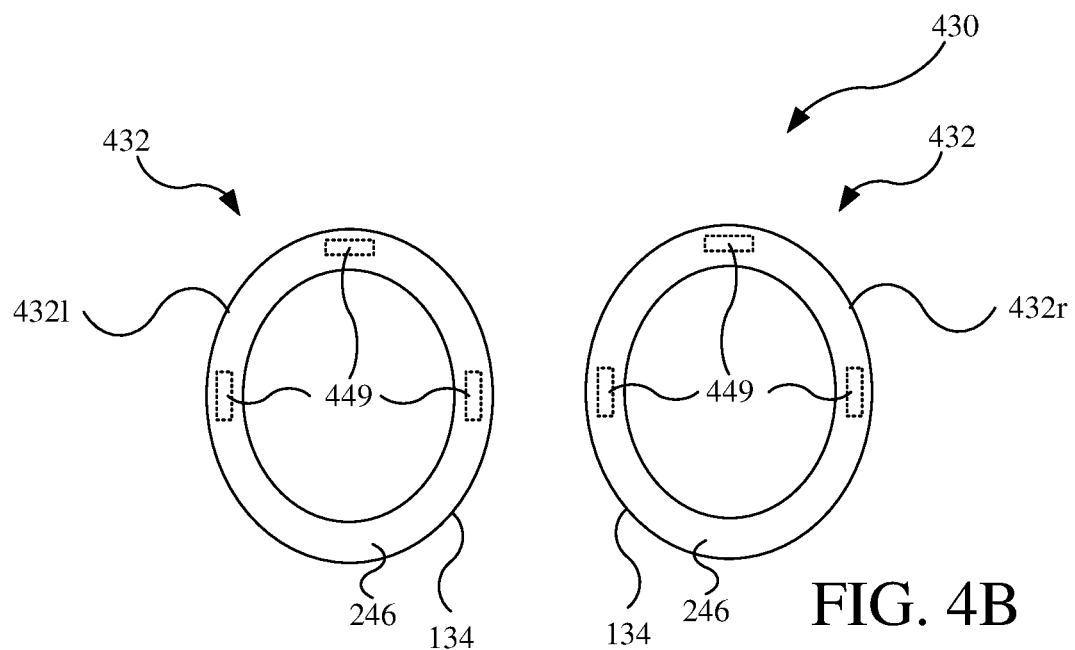
FIG. 4B is a second view of the audio headset of FIG. 4A in a second state.
Figure 4C:
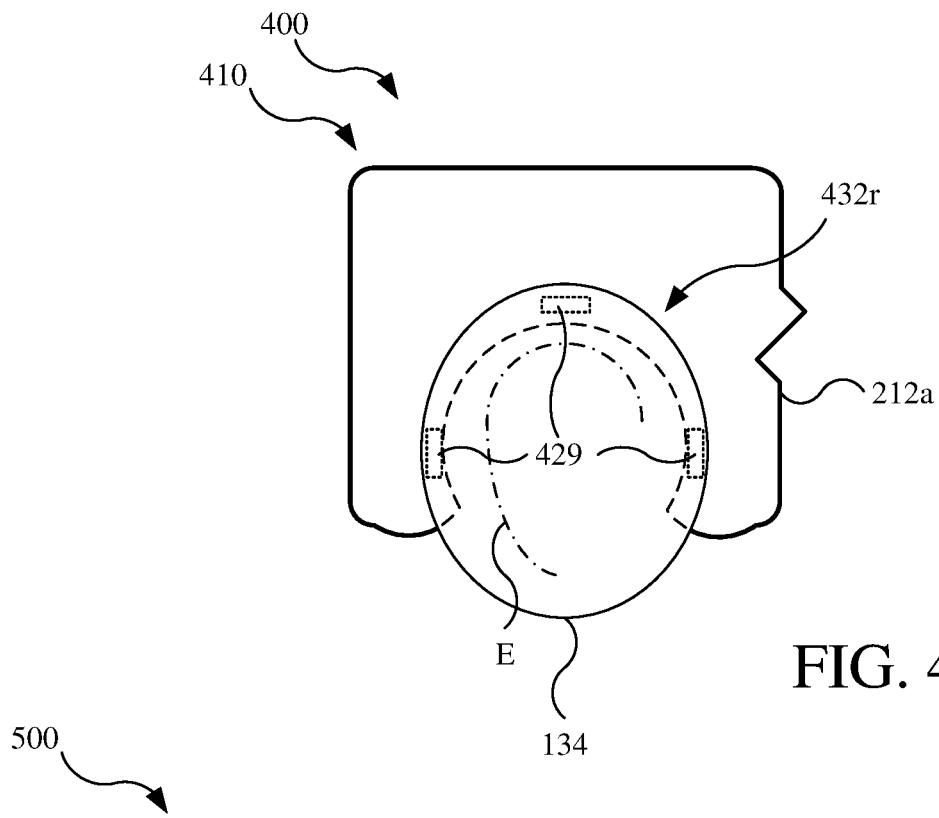
FIG. 4C is a side view of a display system that is a variation of the display system of FIG. 1A, which includes the audio headset of FIG. 4A.

Referring to FIGS. 4A-4C, a display system 400 includes an audio headset 430 having detachable speaker units 432, such as a right detachable speaker unit 432r and a left detachable speaker unit 432l, that are detachably coupleable to a head-mounted display unit 410 and to each other. Each of the detachable speaker units 432 is configured as one of the detachable speaker units 132, 232, 332 and additionally includes coupling features 449. In one example, the coupling features 449 couple the detachable speaker units 432 to each other using magnetic force. For example, the coupling features 449 of the right detachable speaker unit 432r may be or may include permanent magnets or ferromagnetic material, while the coupling features 449 of the left detachable speaker unit 432l are configured to be attracted magnetically thereto, for example, being or including permanent magnets (e.g., of opposite orientation) or ferromagnetic material.

The coupling features 449, when configured to detachably couple the detachable speaker units 432 to each other with magnetic force, may be hidden from view (e.g., being contained within the housing 134 or the pad 246).

The coupling features 449 may, instead of or in addition to using magnetic force, be mechanical mechanisms (e.g., buckles, clamps, or fasteners) that detachably couple the detachable speaker units 432 to each other.

Referring additionally to FIG. 4C, the coupling features 449 may also function to couple the detachable speaker units 432 to the head-mounted display unit 410. For example, the head-mounted display unit 410 may be configured as the head-mounted display unit 110 and include coupling features 429 that correspond to the coupling features 449. For example, as illustrated in FIG. 4C, the coupling features 429 on a right side of the head-mounted display unit 410 may include one or more of the coupling features 429 in a similar arrangement (e.g., position, magnetic pole orientation if using magnetic force, or common male/female configuration if using mechanical engagement) to the coupling features 449 of the left detachable speaker unit 432l. As a result, the right side of the head-mounted display unit 410 may couple to the right detachable speaker unit 432r in a similar manner to which the left detachable speaker unit 432l couples to the right detachable speaker unit 432r.

Referring FIGS. 5-7B, for any one of the display systems 100, 200, 300, 400, the head-mounted display unit 110, 210, 310, 410 and the audio headset 130, 230, 330, 430, or both output sound according to a condition of the audio headset 130, 230, 330, 430. For simplicity in the discussion that follows, only the display system 100 will be referred to, though it should be understood that the other display systems 200, 300, 400 may be configured as described with respect to FIGS. 5-7B. As discussed in further detail below, the condition of the audio headset 130 according to which sound is output may be one or more of whether the detachable speaker units 132 are coupled to each other (i.e., forming an audio unit as described previously), or a position or relative movement of the audio headset 130 or the detachable speaker units 132 relative to the head-mounted display unit 110.

Figure 5:
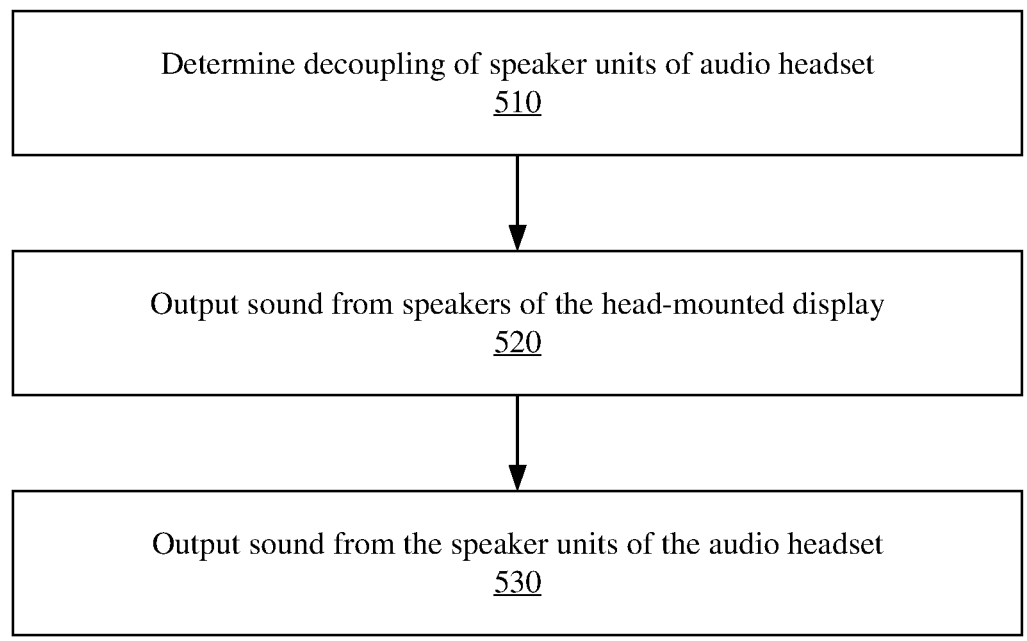
FIG. 5 is a flow diagram of a method for outputting sound from the display system of FIG. 1.

Referring to FIG. 5, in one example, the HMD speakers 118 of the head-mounted display unit 110 output sound when the detachable speaker units 132 are decoupled from each other, for example, upon decoupling the detachable speaker units 132 from each other and a duration thereafter. In such cases, the sound output from the HMD speakers 118 of the head-mounted display unit 110 may represent activation of the audio headset 130 or the detachable speaker units 132 thereof, so as to provide an audio cue or feedback suggesting the sound output capability of the audio headset 130 (e.g., the detachable speaker units 132 thereof).

FIG. 5 illustrates a method 500 for outputting sound from HMD speakers 118 according to a decoupling of the detachable speaker units 132 from each other. The method may, for example, be implemented with the controller 150 and the various sensors of the head-mounted display unit 110 and the detachable speaker units 132.

In a first operation 510 decoupling of the detachable speaker units 132 from each other is determined. Decoupling of the detachable speaker units 132 may, for example, occur due to the user pulling apart the detachable speaker units 132. Decoupling of the detachable speaker units 132 may be determined, for example, by the controller 150 using sensors of the head-mounted display unit 110, such as by processing video received from a camera 116, or the sensing electronics 138d of the detachable speaker units 132, such as by detecting relative movement therebetween or change in proximity therebetween.

In a second operation 520, based on decoupling of the detachable speaker units 132 having been determined, sound is output from the HMD speakers 118 of the head-mounted display unit 110. For example, the controller 150 may cause audio signals and/or power to be sent to the HMD speaker 118 to output sound therefrom. The sound output from the HMD speakers 118 contains aural content. Such aural content may include an audio indicator related to the detachable speaker units 132.

In a third operation 530, sound is output from the detachable speaker units 132 of the audio headset 130. For example, the controller 150 may cause audio signals and/or power to be sent to the detachable speaker units 132. The sound output from the detachable speaker units 132 may contain aural content, such as pertaining to a virtual or mixed reality experience.

In the operations, 520, 530, the sound may be output from the detachable speaker units 132 according to the manners described below with reference to FIGS. 6A to 6B and FIGS. 7A to 7B.

Referring to FIGS. 6A-6B and 7A-7B, audio signal processing is performed (e.g., by the controller 150), such that the HMD speakers 118 of the head-mounted display unit 110 and the detachable speaker units 132 output sounds according to the position of the audio headset 130 and/or the detachable speaker units 132 thereof. As discussed in further detail below, such audio signal processing or other audio controls may include adjusting the volume (see FIGS. 6A-7B and related discussion), equalization (see FIGS. 8A-8B and related discussion), and/or dynamic range (see FIGS. 9A-9B).

Figure 6A:
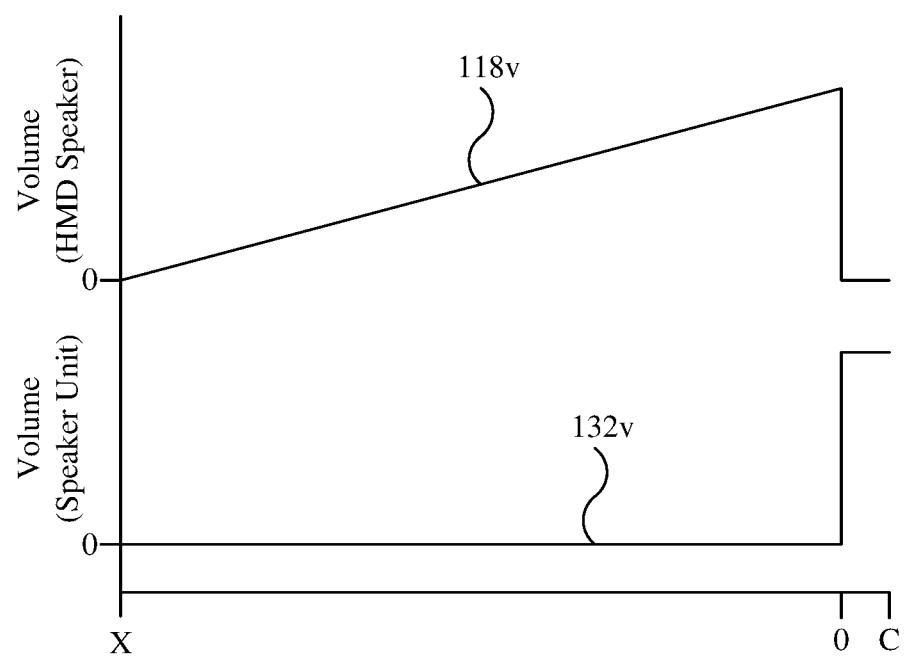
FIG. 6A is a plot of sound output from the display system of FIG. 1.
Figure 6B:
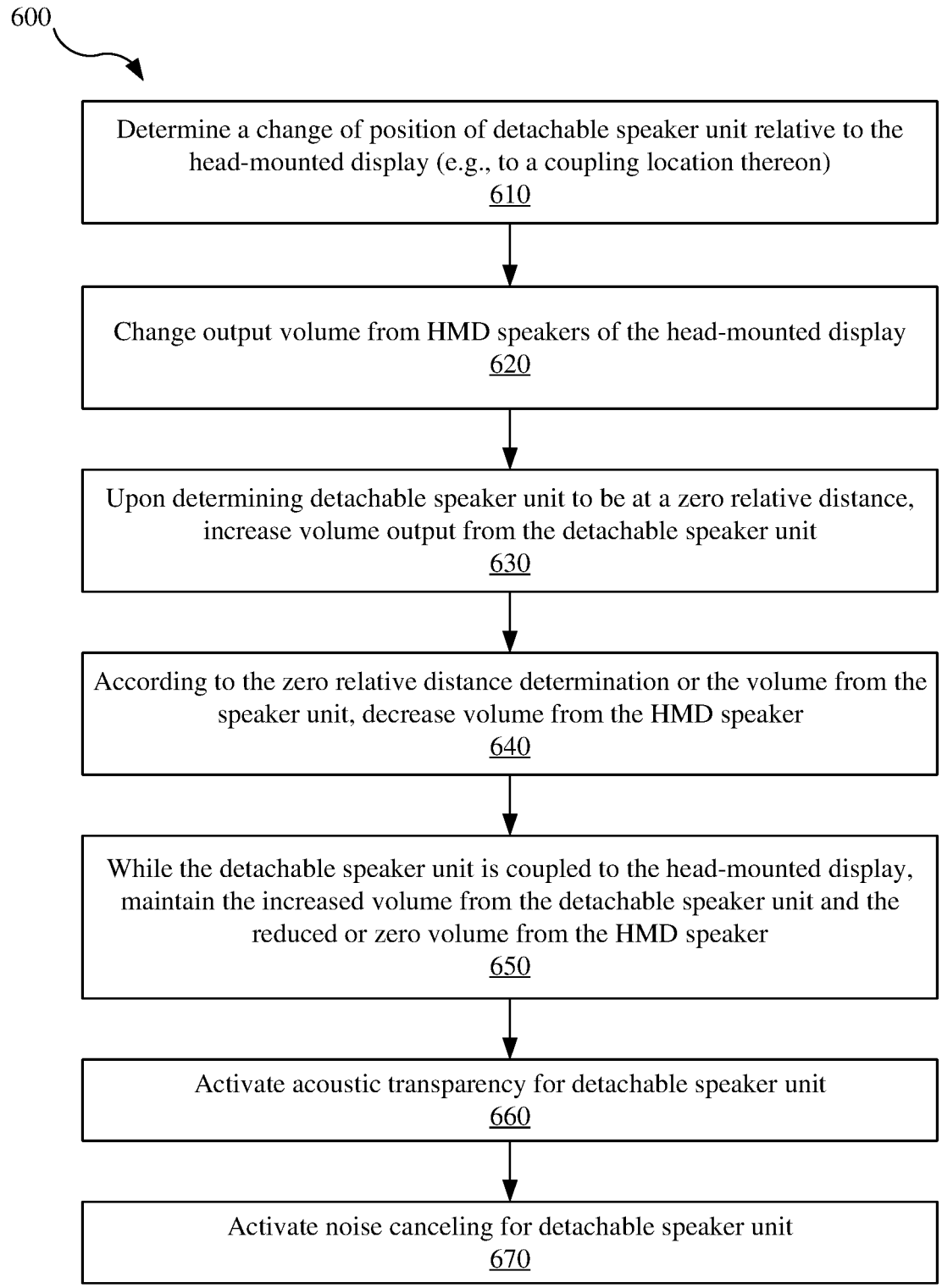
FIG. 6B is a flow diagram of a method of providing sound output from the display system of FIG. 1 according to the plot of FIG. 6A.

With reference to FIGS. 6A-6B, the detachable speaker units 132 may be configured to not output sound until coupled to the head-mounted display unit 110. For example, the detachable speaker units 132 may not have a power source independent of the head-mounted display unit 110 (e.g., do not have internal batteries, do not have a wired connection to a power source independent of the head-mounted display unit 110, or are otherwise powered only when detachably coupled to the head-mounted display unit 110). In other examples, the detachable speaker units 132 may receive audio signals associated with the head-mounted display unit 110 (e.g., the virtual audio content) only when physically coupled thereto, such as via a conductive or optical data connection. In still further examples, the detachable speaker units 132 are otherwise configured to not output the sound until detachably coupled to the head-mounted display unit 110 (e.g., due to software programming).

In such scenarios, the HMD speakers 118 of the head-mounted display unit 110 may output sound so as to simulate or otherwise represent sound being emitted by the detachable speaker units 132, while the detachable speaker units 132 are not coupled to the head-mounted display unit. Upon connecting the detachable speaker units 132 to the head-mounted display unit 110, sound output from the detachable speaker units 132 increases to become the primary sound source (e.g., turning on), while sound output from the HMD speakers 118 may simultaneously or subsequently decrease substantially (e.g., to emit no sound).

FIG. 6A depicts a plot of volume of sound output from the HMD speakers 118 of the head-mounted display unit 110 and the detachable speaker units 132 of the audio headset 130 as a function of distance of the detachable speaker units 132 to a predetermined coupling location at which the detachable speaker unit 132 is coupleable to the audio headset 130. The zero distance (i.e., at the coupling location) is shown on the right of the plot, such that moving rightward on along the plots reflects moving the detachable speaker unit 132 toward the coupling location. The plot also depicts a coupled state indicated by C in which the detachable speaker unit 132 is coupled to the detachable speaker unit 132 at the coupling location. The coupled state C is illustrated after the zero distance, but should be understood as representing a change of state of the coupling state of the detachable speaker unit 132 and not necessarily a further change of distance between the detachable speaker unit 132 and the coupling location. As used herein, the term "volume" generally refers to the level of sound output by an audio output device, and may also be referred to as "sound output level."

As shown, a volume 118v of the HMD speaker 118 increases as the detachable speaker unit 132 is moved closer to the coupling location and reaches a peak volume when the detachable speaker unit 132 is at or near the coupling location. A volume 132v of the detachable speaker unit 132 stays at zero until the detachable speaker unit 132 reaches the coupling location and/or is coupled to the head-mounted display unit 110.

At the coupling location or upon being in the coupled state C, a volume 132v of the detachable speaker unit 132 is increased, for example, to become the primary sound source to the user. Sound output from the speaker unit 132 is maintained while in the coupled state C.

Coincident with the volume 132v of the detachable speaker unit 132 increasing (e.g., when the detachable speaker unit 132 is moved into the coupling location or upon coupling to the head-mounted display unit 110), the volume 118v of the HMD speaker 118 decreases. For example, the volume 118v of the HMD speaker 118 may go to and/or be maintained at zero when the detachable speaker unit 132 is in the coupled state C.

FIG. 6B illustrates a method 600 for outputting sound from the HMD speakers 118 according to a position of the audio headset 130 and/or the detachable speaker units 132 individually relative to the head-mounted display unit 110 (e.g., to a coupling location on the head-mounted display unit 110). The method 600 may, for example, be implemented with the controller 150 and the various sensors of the head-mounted display unit 110 and the detachable speaker units 132. While discussed in conjunction with respect to one of the detachable speaker units 132, the method 600 should be understood to be applicable to each of the detachable speaker units 132 and the audio headset 130.

In a first operation 610, a change of position of the detachable speaker unit 132 relative to the head-mounted display unit 110 (e.g., the coupling location thereon) is determined. The position of the detachable speaker unit 132 may be changed relative to the head-mounted display unit 110, for example, as the user moves relative to the detachable speaker unit 132 (e.g., toward, away, rotating head) or as the user moves the detachable speaker unit 132 (e.g., moving the detachable speaker unit 132 to the coupling location). The change of position or relative motion of the detachable speaker unit 132 may be determined, for example, by the controller 150 using sensors of the head-mounted display unit 110, such as by processing video received from the camera 116, or the sensing electronics 138d of the detachable speaker units 132 (e.g., if the detachable speaker units 132 are powered independent of being coupled to the head-mounted display unit 110), such as by detecting movement toward the head-mounted display unit and or change in proximity therebetween.

In a second operation 620, based on the change of the position of the detachable speaker unit 132 relative to the head-mounted display unit 110, the volume 118v of the HMD speaker 118 is changed. For example, as shown in FIG. 6A, the volume 118v is increased or decreased as the detachable speaker unit 132 is, respectively, moved toward or away from the head-mounted display unit 110 (e.g., the coupling location thereon). The controller 150 may cause audio signals and/or power to be sent to the HMD speaker 118 to output sound therefrom at the volume 118v. The sound output from the HMD speaker 118 contains the aural content, such as that pertaining to the virtual or mixed reality experience.

In a third operation 630, based on determining that the detachable speaker unit 132 is at a zero distance relative to the head-mounted display unit 110 or upon coupling the detachable speaker unit 132 to the head-mounted display unit 110 at the predetermined location, the volume 132v of the detachable speaker unit 132 is substantially increased. For example, the controller 150 may determine that the detachable speaker unit 132 is at the zero distance using the sensors of the head-mounted display unit 110 and/or the detachable speaker unit 132 as described above with respect to the second operation 620, and/or by determining that the detachable speaker unit 132 is coupled to the head-mounted display unit 110. The controller 150 may cause audio signals and/or power to be sent to the detachable speaker unit 132 to output sound therefrom at the substantially increased volume 132v. For example, the volume 132v of the detachable speaker unit 132 may be increased from zero to provide the primary or only sound output to the user.

In a fourth operation 640, based the determination of the zero distance, coupling of the detachable speaker unit 132, or according to the volume 132v of the detachable speaker unit 132 having been substantially increased, the volume 118v of the HMD speaker 118 is substantially reduced (e.g., to zero). For example, the controller 150 may cause audio signals and/or power to be sent to the HMD speaker 118 to reduce the volume 118v or to not be sent to the HMD speaker 118 to reduce the volume 118v to zero. The fourth operation 640 may occur coincident with the third operation 630, such as simultaneously therewith or shortly thereafter.

In a fifth operation 650, while the detachable speaker unit 132 is coupled to the head-mounted display unit 110 (e.g., is in the coupled state shown in FIG. 6A), the detachable speaker unit 132 continues to provide sound output to the user, while the HMD speaker 118 provides secondary or no sound to the user.

In a sixth operation 660, acoustic transparency of the detachable speaker unit 132 may be activated. Acoustic transparency is implemented by the ambient sound electronics 138e (e.g., the microphone 138e' and signal processor 138e"), so as to produce the processed ambient sound as described above. Acoustic transparency may be activated automatically upon coupling of the detachable speaker unit 132 to the head-mounted display unit 110, for example, if the display system 100 is operating in a mixed reality mode or by default, or may be activated by selection of the user. Acoustic transparency may provide a mixed reality experience by transmitting the processed ambient sound to the user despite the detachable speaker unit 132 physically hindering passage of ambient sound directly to the user's ear E.

In a seventh operation 670, noise cancellation of the detachable speaker unit 132 may be activated. Noise cancellation is implemented by the ambient sound electronics 138e, so as to produce the processed cancelling sound as described above. Noise cancellation may be activated automatically upon coupling of the detachable speaker unit 132 to the head-mounted display unit 110, for example, if the display system 100 is operating in a virtual reality mode (e.g., when providing virtual visual content with no visual pass through), or by default (e.g., after passage of a predetermined time period after connecting the detachable speaker unit 132 to the head-mounted display unit 110, or after a predetermined time of operating the acoustic transparency), or may be activated by selection of the user. Noise cancellation may provide a virtual reality experience by further inhibiting hearing of sounds from the real environment by the user. It should be noted that noise cancellation may not be activated or may be activated without activating acoustic transparency (e.g., one, the other, or both of the sixth operation 660 and the seventh operation 670 may be performed).

In a variation of the method 600, the first operation 610 and the second operation 620 of determining the position of the detachable speaker unit 132 (i.e., the first operation 610) and changing the volume 118v of the HMD speaker 118 (i.e., the second operation 620) based thereon may be omitted. In such cases, the third operation 630 and the fourth operation 640 of increasing the volume 132v of the detachable speaker unit 132 based on determining the zero position or upon coupling (i.e., the third operation 630) and decreasing the volume 118v of the HMD speaker 118 (i.e., the fourth operation 640) are still performed.

The method 600 and the aforementioned variation thereof may be used in conjunction with the method 500 described previously, for example, in the third operation 530.

Figure 7A:
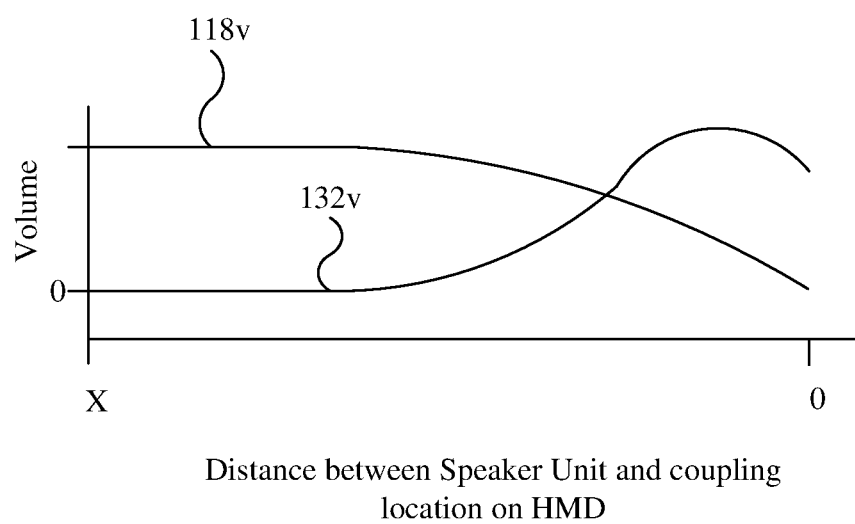
FIG. 7A is a plot of sound output from the display system of FIG. 1.
Figure 7B:
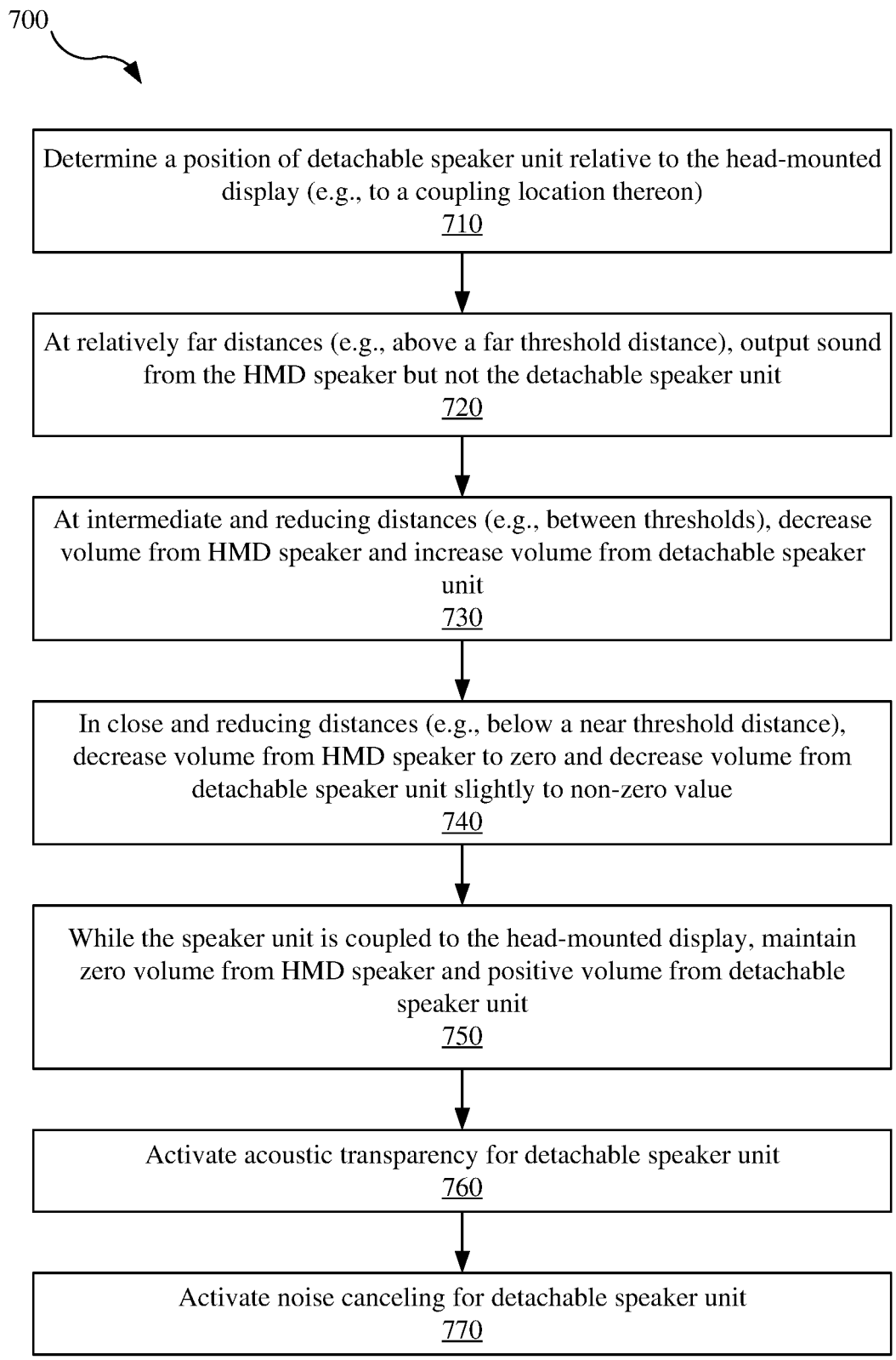
FIG. 7B is a flow diagram of a method of providing sound output from the display system of FIG. 1 according to the plot of FIG. 7A.

With reference to FIGS. 7A-7B, the detachable speaker units 132 may be configured output sound prior to being coupled to the head-mounted display unit 110. For example, the detachable speaker units 132 may be powered independent of being coupled the head-mounted display unit (e.g., by having internal batteries or a wired connection to a power source). In such scenarios, the HMD speakers 118 of the head-mounted display unit 110 and the detachable speaker units 132 may blend sound output to limit fluctuating volume experienced by the user, such as prior to the detachable speaker unit 132 being coupled to the head-mounted display unit 110.

The HMD speakers 118 of the head-mounted display unit 110 and the detachable speaker units 132 output sounds according to movement of the audio headset 130 (e.g., when the detachable speaker units 132 are coupled to each other) and/or movement of the detachable speaker units 132 individually. For example, when the detachable speaker unit 132 is a relatively far distance from the head-mounted display unit 110, sound be output from only the HMD speakers 118. As the detachable speaker units 132 are moved closer to the head-mounted display unit 110, the detachable speaker units 132 may increase in volume, such that the user hears sound being simultaneously emitted from both the HMD speakers 118 of the head-mounted display unit 110 and the detachable speaker units 132. As the detachable speaker units 132 are moved still closer to the head-mounted display unit 110, such as for coupling the detachable speaker units 132 thereto, the HMD speakers 118 and the detachable speaker units 132 may cooperatively provide sound output to limit volume fluctuation by decreasing volume from the HMD speakers 118, while simultaneously increasing and then decreasing volume from the detachable speaker unit 132. This may help limit fluctuation in volume perceived by the user fluctuations in volume perceived by the user FIG. 7A depicts a plot of volume of sound output from the HMD speakers 118 and the detachable speaker units 132 as a function of distance of the detachable speaker units 132 to a predetermined coupling location at which the detachable speaker unit 132 is coupleable to the audio headset 130. The zero distance (i.e., at the coupling location) is shown on the right of the plot, such that moving rightward along the plot reflects moving the detachable speaker unit 132 toward the coupling location.

As shown, at relatively far distances between the detachable speaker unit 132 and the coupling location on the head-mounted display unit 110, the HMD speaker 118 outputs sound at the volume 118v, while the detachable speaker unit 132 outputs no sound. At such relatively far distances, the volume 118v of the HMD speaker 118 may be independent of such distance and/or be constant. As the detachable speaker unit 132 is moved still closer to the coupling location, the volume 118v of the HMD speaker 118 may decrease, while the volume 132v of the detachable speaker unit 132 increases. At such closer distances, the user may hear sound from output from both the HMD speaker 118 and the detachable speaker unit 132. At close distances, such as when moving to the zero distance at which the detachable speaker unit couples to the head-mounted display unit 110 over the user's ear E, the volume 118v output by the HMD speaker 118 reduces to zero, while the volume 132v of the detachable speaker unit 132 may reduce to a final output level. The reduction in the volume 132v of the detachable speaker unit 132 may, for example, account for an increase in volume that might otherwise be perceived by the user due to reduced distances and/or sound isolation that might be perceived from the real environment due to the housing 134 or the padding 246 of the detachable speaker unit 132 engaging the ear E of the user.

FIG. 7B illustrates a method 700 for outputting sound from the HMD speakers 118 and the detachable speaker units 132 according to a position of the audio headset 130 and/or the detachable speaker units 132 individually relative to the head-mounted display unit 110 (e.g., to a coupling location on the head-mounted display unit 110). The method 700 may, for example, be implemented with the controller 150 and the various sensors of the head-mounted display unit 110 and the detachable speaker units 132. While discussed in conjunction with respect to just one of the detachable speaker units 132, the method 700 should be understood to be applicable to each of the detachable speaker units 132 and the audio headset 130.

In a first operation 710, a position of the detachable speaker unit 132 relative to the head-mounted display unit 110 (e.g., the predetermined coupling location thereon) is determined, which may be performed in the manner described above for the first operation 610 of the method 600.

In a second operation 720, based on the position of the detachable speaker unit 132 relative to the head-mounted display unit 110 being relatively far (e.g., greater than a threshold distance), the HMD speaker 118 outputs sounds (i.e., the volume 118v is greater than zero), while the detachable speaker unit 132 outputs no sound (i.e., the volume 132v is zero). The controller 150 may cause audio signals and/or power to be sent to the HMD speaker 118 to output the sound therefrom. The sound output from the HMD speaker 118 contains the aural content, such as that pertaining to the virtual or mixed reality experience.

In a third operation 730, based on the position of the detachable speaker unit 132 relative to the head-mounted display unit 110 being in intermediate range (e.g., below the threshold distance and above a second threshold) and reducing, the volume 118v of the HMD speaker 118 is reduced, while the volume 132v of the detachable speaker unit 132 is simultaneously increased. The controller 150 may cause audio signals and/or power to be sent to the HMD speaker 118 and the detachable speaker unit 132.

In a fourth operation 740, based on the position of the detachable speaker unit 132 relative to the head-mounted display unit 110 being in close proximity (e.g., below the second threshold distance to the zero distance) and reducing to the zero distance, the volume 118v of the HMD speaker 118 is reduced to zero and the volume 132v of the detachable speaker unit 132 is reduced slightly to a non-zero value. The controller 150 may cause audio signals and/or power to be sent to the HMD speaker 118 to output the sound therefrom.

In a fifth operation 750, while the detachable speaker unit 132 is coupled to the head-mounted display unit 110, the detachable speaker unit 132 continues to provide sound output to the user with the volume 132v being greater than zero, while the HMD speaker 118 provides no sound to the user.

In a sixth operation 760, acoustic transparency of the detachable speaker unit 132 may be activated, as described previously for the sixth operation 670 of the method 600.

In a seventh operation 770, noise cancellation of the detachable speaker unit 132 may be activated, as described previously for the seventh operation 670 of the method 600.

It should be noted that aspects of the method 600 may be incorporated into the method 700 in which case the volume 118v of the HMD speaker 118 may change to simulate movement of the detachable speaker unit 132 with sound being emitted therefrom. For example, in the second operation 720, the volume 118v may increase to simulate the detachable speaker unit 132 being moved closed to the coupling location on the head-mounted display unit 110, and in the third operation 730 may increase or stay constant. Further, the method 700 may be used in conjunction with the method 500 described previously, for example, in the third operation 530.

Figure 8A:
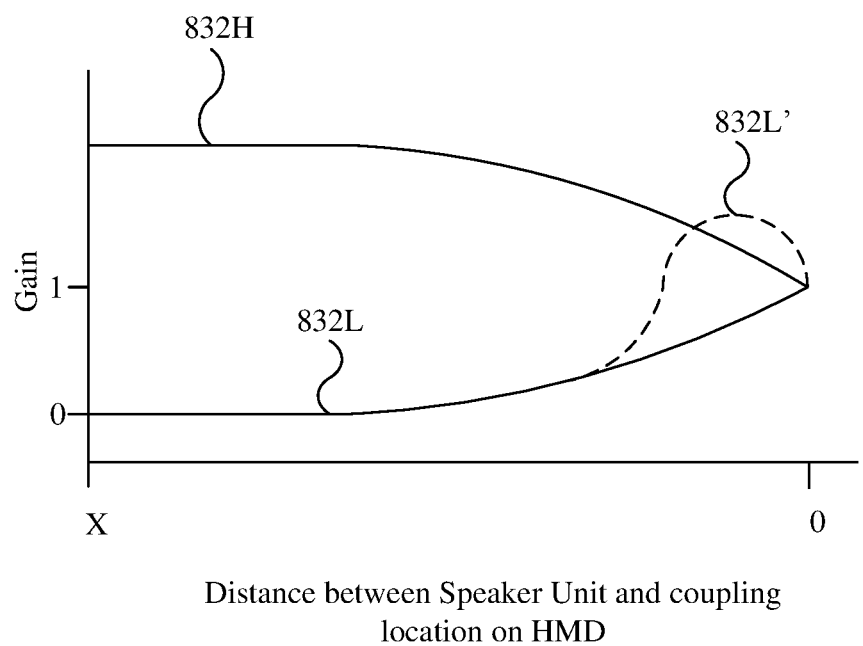
FIG. 8A is a plot of gain vs. distance for equalization of sound output from the display system of FIG. 1.
Figure 8B:
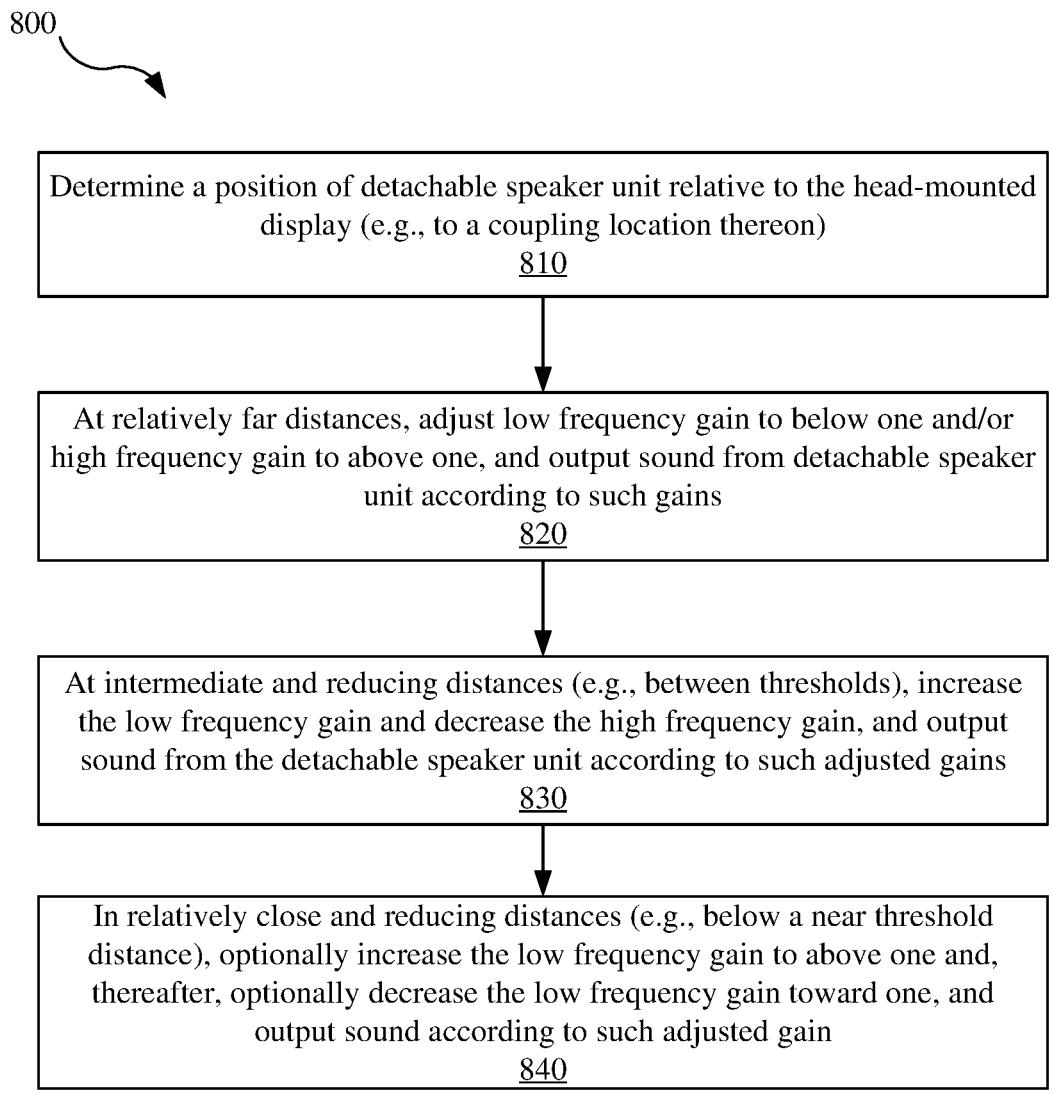
FIG. 8B is a flow diagram of a method of providing sound output from the display system of FIG. 1 according to the plot of FIG. 8A.

With reference to FIGS. 8A-8B, for the detachable speaker units 132 that are configured to output sound when detached from the head-mounted display unit 110, equalization of the sound output by the detachable speaker units 132 may be varied according to the distance from the detachable speaker unit 132 to the head-mounted display unit 110 (e.g., the coupling location thereon). For example, the gain of low frequency sounds (e.g., in a bass range) may increase and the gain of higher frequency sounds may decrease as the detachable speaker unit 132 is moved close to the head-mounted display unit 110. Decreasing the gain at the low frequency and increasing the gain at the higher frequencies concentrates power output on the higher frequency sounds, which generally consume less power than low frequency sounds for a given volume output. Since power output of the detachable speaker units 132 may be limited due to the portable/detachable nature (e.g., being battery powered) and/or primary use case (e.g., being held in close proximity to the user's ear E), equalization in this manner may allow the user to experience louder sound while the detachable speaker units 132 are at relatively far distances than if equalization were not performed.

Referring to FIG. 8A, the gain of low frequency sound that is to be output by the detachable speaker unit 132 is referred to as the low frequency gain 832L, while the gain of the higher frequency sound that is to be output by the detachable speaker unit 132 is referred to as the high frequency gain 832H. The low frequency gain 832L and the high frequency gain 832H are represented by plots with the Y-axis being gain and the X-axis being distance between the detachable speaker unit 132 and the head-mounted display unit 110 (e.g., the coupling location thereon) with the zero distance on the right (i.e., the detachable speaker unit 132 moves closer to the coupling location moving rightward along the plots).

At relatively far distances between the detachable speaker unit 132 and the head-mounted display unit 110, the low frequency gain 832L is below one, for example, starting at zero. As the distance decreases, such as when the user moves the detachable speaker unit 132 toward the head-mounted display unit 110 (e.g., to the coupling location over the user's ear E), the low frequency gain increases, for example, ending at one. Conversely, the high frequency gain 832H is above one at relatively far distances and decreases as the distance decreases, for example, ending at one. As a result, at relatively far distances, the low frequency gain 832L is below one and the high frequency gain 832H is above one, and the difference between the low frequency gain 832L and the high frequency gain 832H decreases as the distance decreases, for example, with the difference ending at zero.

Instead or additionally, at relatively close distances, the gain for low frequency sound may be increased to above one at relatively close distances, such as when the detachable speaker unit 132 is in the user's hand and being moved toward the head-mounted display unit 110 to be coupled thereto. Such low frequency sound may have a tendency to roll off (e.g., be attenuated) when the detachable speaker unit 132 is held by the user, and increasing the gain for such low frequency sound may provide flatter sound, or the perception of flatter sound, to the user. Thus, referring again to FIG. 8A, an alternative gain of low frequency sound that is to be output by the detachable speaker unit 132 is referred to as the low frequency gain 832L'. At relatively close distances between the detachable speaker unit 132 and the head-mounted display unit 110, the low frequency gain 832L' may increase to above one and, as the distance decreases, decrease in a gradual (as shown) or stepped manner, for example, toward and/or to one. At relatively far distances, the low frequency gain 832L' may be the same as the low frequency gain 832L (e.g., starting below one, such as at zero, and increasing as the distance decreases) or other value (e.g., being one).

FIG. 8B illustrates a method 800 for outputting sound from the detachable speaker units 132 using equalization audio signal processing according to a position of the audio headset 130 and/or the detachable speaker units 132 individually relative to the head-mounted display unit 110 (e.g., to a coupling location on the head-mounted display unit 110). The method 800 may, for example, be implemented with the controller 150 and the various sensors of the head-mounted display unit 110 and the detachable speaker units 132. While discussed in conjunction with respect to just one of the detachable speaker units 132, the method 800 should be understood to be applicable to each of the detachable speaker units 132 and the audio headset 130. The method 800 may be referred to as an equalization method or an equalization audio signal processing method, and may be used alone and/or in conjunction with the method 700.

In a first operation 810, a position of the detachable speaker unit 132 relative to the head-mounted display unit 110 (e.g., the predetermined coupling location thereon) is determined, which may be performed in the manner described above for the first operation 610 of the method 600.

In a second operation 820, based on the position of the detachable speaker unit 132 relative to the head-mounted display unit 110 being relatively far (e.g., greater than a threshold distance), the low frequency gain 832L is below one and/or the high frequency gain 832H is above one, and sound is output from the detachable speaker unit 132 according to the low frequency gain 832L and/or the high frequency gain 832H. The controller 150 may adjust the low frequency gain 832L and the high frequency gain 832H, for example as shown in FIG. 8A, and cause audio signals and/or power to be sent to the detachable speaker unit 132 to output the sound therefrom according to such adjusted gains. The output sound may contain the aural content, such as that pertaining to the virtual or mixed reality experience.

In a third operation 830, based on the position of the detachable speaker unit 132 relative to the head-mounted display unit 110 being in an intermediate range (e.g., below the threshold distance and above a second threshold) and reducing, the low frequency gain 832L is increased and/or the high frequency gain 832H is decreased, and sound is output from the detachable speaker unit 132 according to the low frequency gain 832L and/or the high frequency gain 832H (as adjusted). The controller 150 may adjust the low frequency gain 832L and the high frequency gain 832H, for example as shown in FIG. 8A, and cause audio signals and/or power to be sent to the detachable speaker unit 132 to output the sound therefrom according to such adjusted gains.

In a fourth operation 840, based on the position of the detachable speaker unit 132 relative to the head-mounted display unit 110 being in a relatively close range (e.g., below the second threshold) and reducing, the low frequency gain may optionally be increased to above one and may thereafter further optionally decease toward one as the distance reduces to zero. The controller 150 may adjust the low frequency gain 832L', and cause audio signals and/or power to be sent to the detachable speaker unit 132 to output the sound therefrom according to such gain.

Figure 9A:
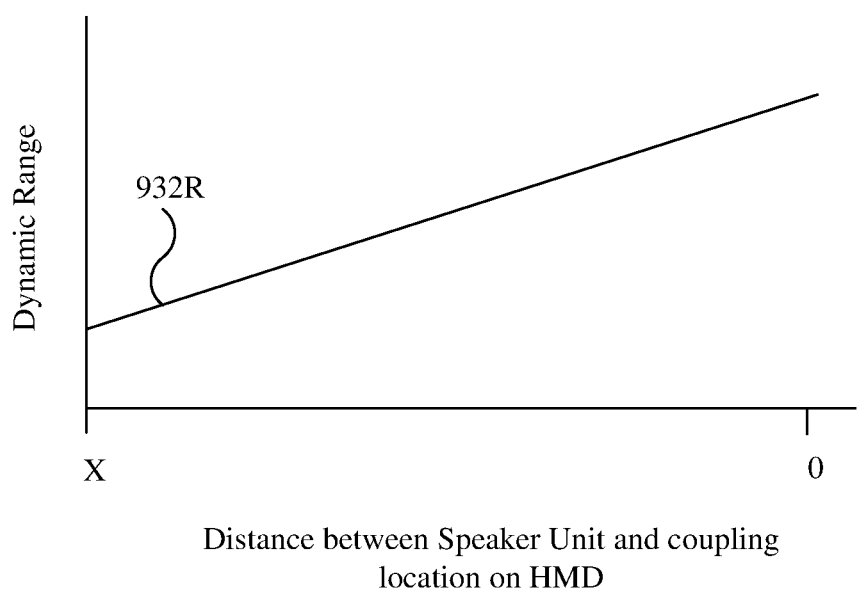
FIG. 9A is a plot of dynamic range vs. distance for dynamic range compression of sound output from the display system of FIG. 1.
Figure 9B:
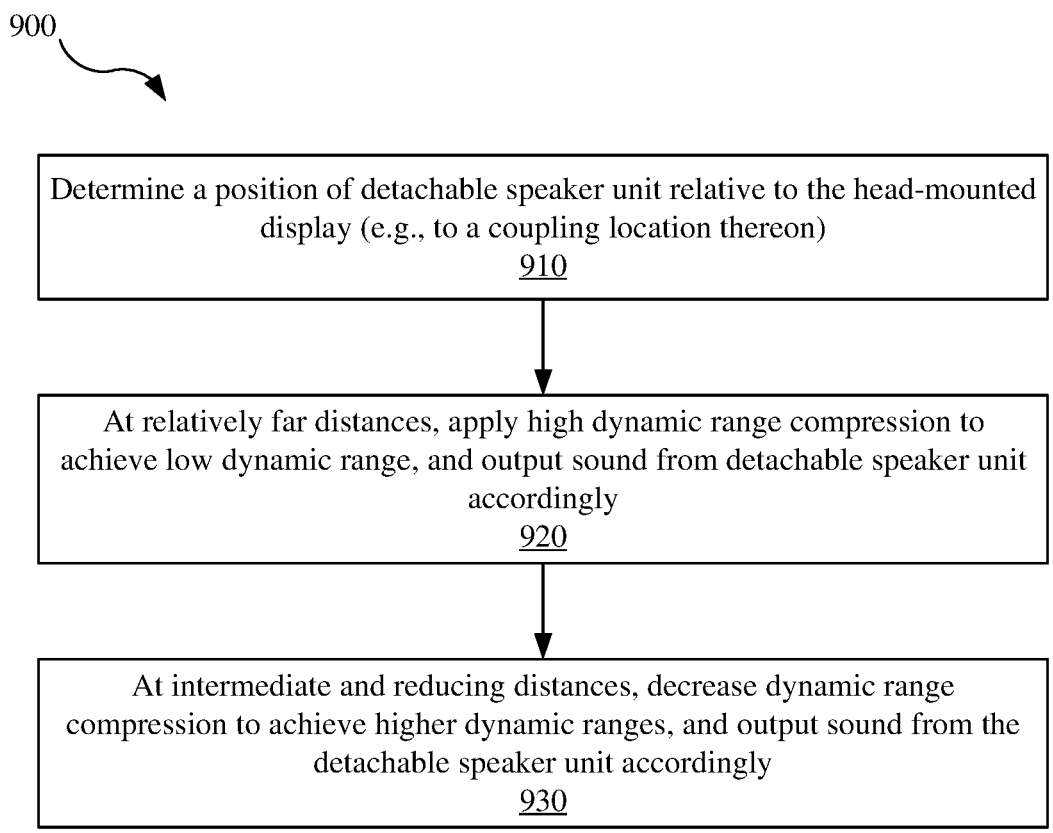
FIG. 9B is a flow diagram of a method of providing sound output from the display system of FIG. 1 according to the plot of FIG. 9A.

With reference to FIGS. 9A-9B, for the detachable speaker units 132 that are configured output sound when detached from the head-mounted display unit 110, the dynamic range of the sound output by the detachable speaker units 132 may be varied according to the distance of the detachable speaker unit 132 relative to the head-mounted display unit 110 (e.g., the coupling location thereon). The dynamic range generally refers to the range of volume between loud and soft sounds, while dynamic range compression refers to audio signal processing of decreasing the volume of the louder sounds and/or amplifying the quieter sounds. For example, dynamic range compression may be applied at decreasing levels as the detachable speaker unit 132 is moved closer to the head-mounted display unit 110, thereby resulting in a lower dynamic range at relatively far distances and higher dynamic range at lower distances. Applying dynamic range compression in this manner may, for example, allow the user to hear more sounds and/or experience a consistent louder volume from the detachable speaker unit 132 at relatively far distances.

Referring to FIG. 9A, the dynamic range 932R of the sound that is to be output by the detachable speaker unit is illustrated as a function of the distance between the detachable speaker unit 132 and the head-mounted display unit 110 (e.g., the coupling location thereon). As the distance decreases, less dynamic compression is applied, such that the dynamic range 932R increases.

FIG. 9B illustrates a method 900 for outputting sound from the detachable speaker units 132 using dynamic range compression audio signal processing according to a position of the audio headset 130 and/or the detachable speaker units 132 individually relative to the head-mounted display unit 110 (e.g., to a coupling location on the head-mounted display unit 110). The method 900 may, for example, be implemented with the controller 150 and the various sensors of the head-mounted display unit 110 and the detachable speaker units 132. While discussed in conjunction with respect to just one of the detachable speaker units 132, the method 900 should be understood to be applicable to each of the detachable speaker units 132 and the audio headset 130. The method 900 may be referred to as a dynamic range compression method or a dynamic range compression audio signal processing method, and may be used alone and/or in conjunction with the method 700 and/or the method 800.

In a first operation 910, a position of the detachable speaker unit 132 relative to the head-mounted display unit 110 (e.g., the predetermined coupling location thereon) is determined, which may be performed in the manner described above for the first operation 610 of the method 600.

In a second operation 920, based on the position of the detachable speaker unit 132 relative to the head-mounted display unit 110 being relatively far (e.g., greater than a threshold distance), a relatively high level of dynamic range compression is applied to achieve a relatively low dynamic range. The controller 150 may apply dynamic range compression, for example, to achieve the dynamic range 932R shown in FIG. 9A, and cause audio signals and/or power to be sent to the detachable speaker unit 132 to output the sound therefrom according to such dynamic range. The output sound may contain the aural content, such as that pertaining to the virtual or mixed reality experience.

In a third operation 930, based on the position of the detachable speaker unit 132 relative to the head-mounted display unit 110 being in intermediate range (e.g., below the threshold distance) and reducing, the level of dynamic range compression applied is reduced to achieve a relatively high dynamic range. The controller 150 may apply dynamic range compression, for example, to achieve the dynamic range 932R shown in FIG. 9A, and cause audio signals and/or power to be sent to the detachable speaker unit 132 to output the sound therefrom according to such dynamic range.

Referring to FIGS. 10A-10D, the display system 100 may be configured to display a visual indicator 1060 associated with the audio headset 130. For example, prior to the detachable speaker units 132 being coupled to the head-mounted display unit 110, the head-mounted display unit 110 may provide visual content that includes the visual indicator 1060, such as an animation, icon, or other indicator, which may be in spatial proximity to the audio headset 130. The visual indicator 1060 may suggest or otherwise indicate the sound output capability of the audio headset 130 and/or provide instructions for use thereof. While discussed in conjunction with the display system 100 and the components thereof (e.g., the head-mounted display unit 110 and the audio headset 130), the concepts and method discussed with respect to FIGS. 10A-10D are applicable to the display systems 200, 300, 400.

Figure 10A:
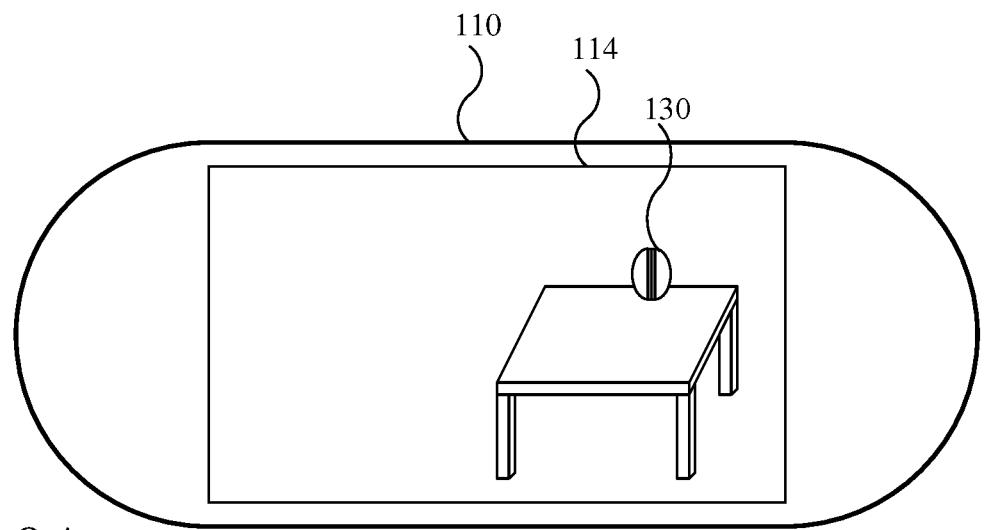
FIG. 10A is a view of the head-mounted display unit having a field of view that includes a real environment and an audio output device.
Figure 10B:
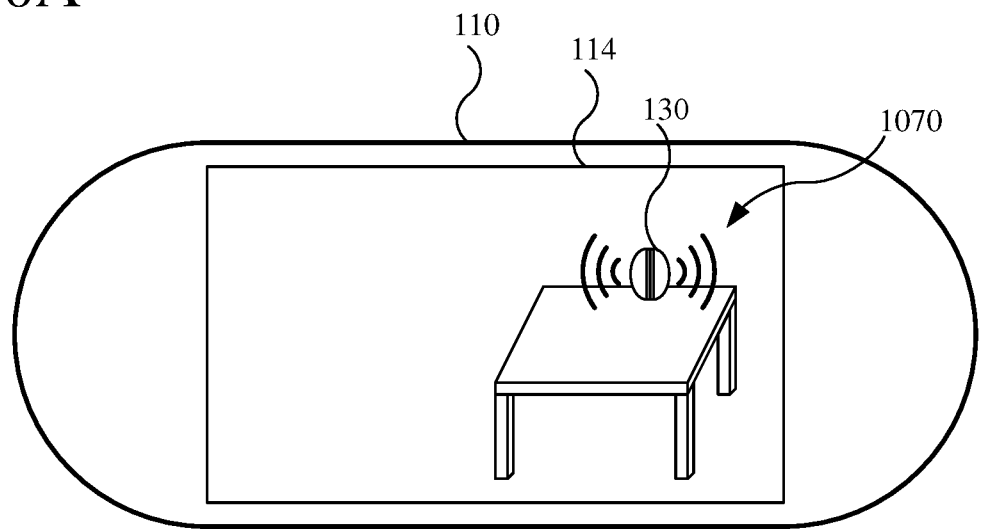
FIG. 10B is another view of the head-mounted display unit having the field of view of FIG. 8A and additionally displaying a visual indicator.

For example, in FIG. 10A, the user may view the display screen 114 of the head-mounted display unit 110 and see the audio headset 130 within the field of view as a real object in a mixed reality experience (e.g., via video or optical pass-through as described above), or as a virtual object in a virtual reality experience, wherein the audio headset 130 is depicted by rendered graphics. For illustrative purposes, the audio headset 130 is positioned on a table of the real environment. As shown in FIG. 10B, the display screen 114 may also display the visual indicator 1060, which may be visually associated with the audio headset 130, for example, by being depicted in close proximity thereto, such as by surrounding and/or overlaying the audio headset 130.

The visual indicator 1060 suggests or otherwise communicates the audio capabilities and/or use of the audio headset 130. In one example, the visual indicator is an audio-related icon, such as sound waves (as shown), a depiction of traditional headphones, or other icon suggestive of the audio capabilities or use of the audio headset 130. Instead or additionally, the visual indicator 1060 may be an animation, such as sound waves emitting from the audio headset 130. The motion and/or intensity of the visual indicator 1060 (e.g., animation of sound waves) may be correlated to the sound related thereto, for example, by changing appearance in accordance with the sound being output. For example, the visual indicator 1060 may visually pulsate according to a beat of the sound or music (e.g., faster or slower according to a faster or slower beat, respectively, of the sound) or intensity of a sonic event (e.g., increasing in size and/or pulsating faster coincident with a real or virtual event expected to produce a loud and/or intense sound, such as an explosion).

The visual indicator 1060 may be positioned in spatial proximity (e.g., in close proximity, overlaying, and/or surrounding) to the audio headset 130 and/or the detachable speaker units 132 individually. The location of the audio headset 130 may be determined in the manners described above, for example, by using the sensors of the head-mounted display unit 110 (e.g., the camera 116 for video recognition of the audio headset 130, or the motion sensors 120) and/or the sensing electronics 138d of the detachable speaker units 132 (e.g., camera, motion sensors, etc.).

Figure 10C:
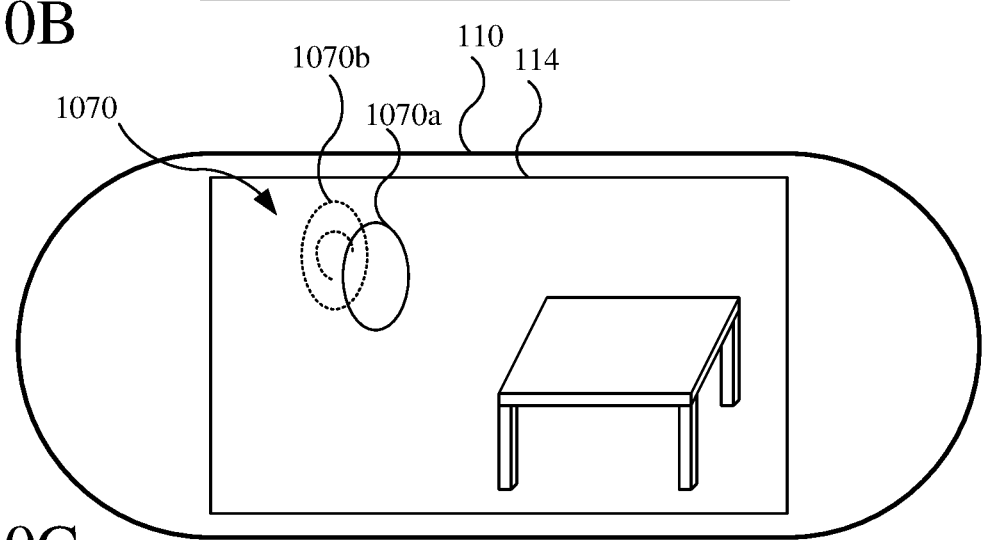
FIG. 10C is another view of the head-mounted display unit having a field of view that does not include the audio output device and additionally displaying another visual indicator.

The visual indicator 1060 or variations thereof may suggest or otherwise communicate how to use the audio headset 130, for example, displaying one or more diagrams illustrating how to use the audio headset 130. Referring to FIG. 10C, for example, when the detachable speaker units 132 are not in the field of view of the user, a visual indicator 1070 may guide the user in moving the detachable speaker unit 132 to the coupling location on the head-mounted display unit 110. The visual indicator 1070 includes an illustration 1070a representing the detachable speaker unit 132 and another illustration 1070b representing the coupling location. The illustrations 1070a, 1070b may be displayed in a spatial relationship to each other representing the physical spatial arrangement between the detachable speaker unit 132 and the coupling location on the head-mounted display unit 110, thereby communicating to the user required movement for coupling the detachable speaker unit 132. For example, as shown, the illustration 1070a (i.e., representing the detachable speaker unit 132) is positioned downward and rightward of the illustration 1070b (i.e., representing the coupling location on the head-mounted display unit 110), which may represent the right detachable speaker unit 132 being forward of and lower than the coupling location. The visual indication 1070 may instead or additionally include iconography (e.g., arrows), text (e.g., written text), and/or animations (e.g., depicting movement of the illustration 1070a toward the illustration 1070b) instructing the user where to move the detachable speaker unit 132 for being coupled to the head-mounted display unit 110.

Figure 10D:
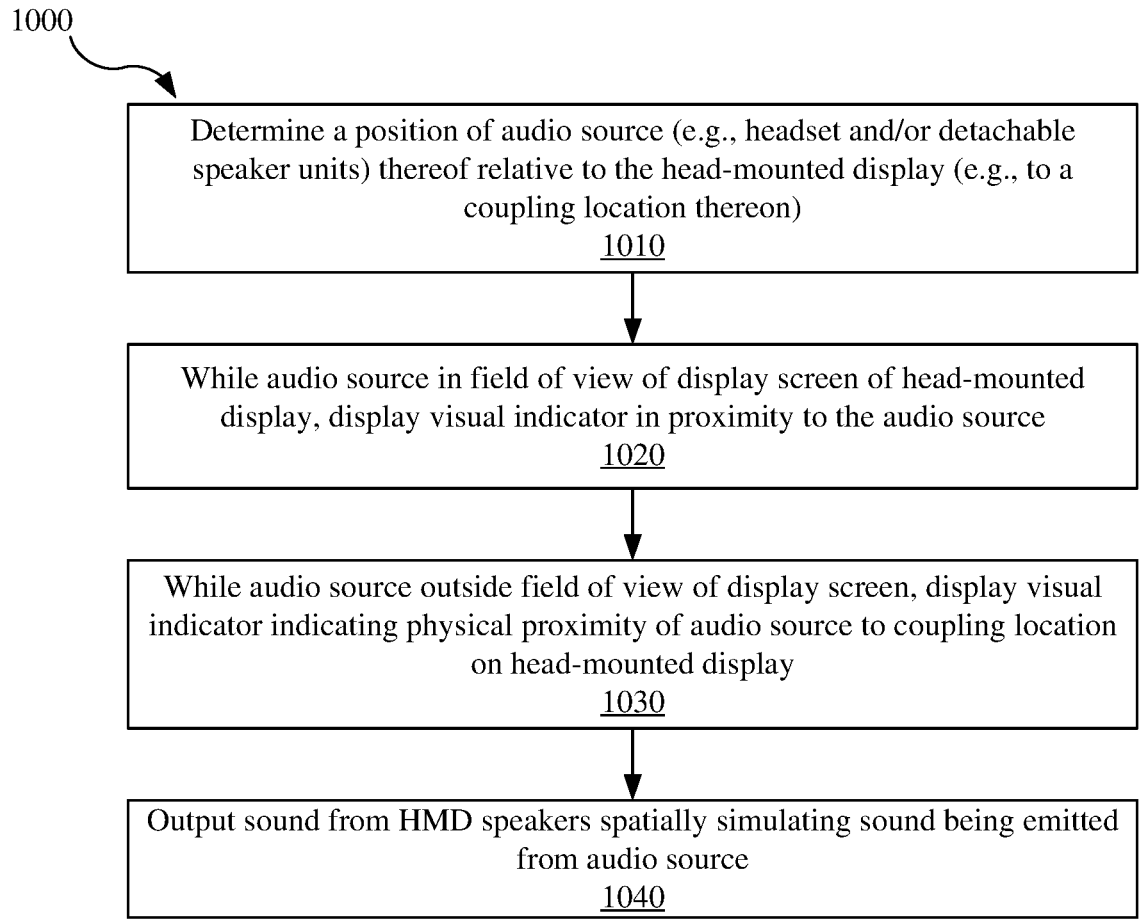
FIG. 10D is a flow diagram of a method for providing the visual indicators of FIGS. 8B and 8C.

Referring to FIG. 10D, a method 1000 for providing visual content with a display system and, in particular, for providing a visual indicator related to an audio output device. The display system may, for example, be one of the display systems 100, 200, 300, 400. The method 1000 may, for example, be implemented with the controller 150 and the various sensors of the head-mounted display unit 110 and the detachable speaker units 132. For simplicity, the method 1000 is discussed in conjunction with the display system 100 but should be understood as being applicable to the display systems 200, 300, 400. Additionally, while discussed generally with respect to the detachable speaker unit 132 below, the method 1000 should be understood to be applicable to each of the detachable speaker units 132, the audio headset 130, or another audio output device, such as an external speaker.

In a first operation 1010, a position of the audio output device (e.g., the audio headset 130, the detachable speaker unit 132, or other audio output device) is determined. The position of the audio output device may be determined, for example, by the controller 150 using sensors of the head-mounted display unit 110, such as by processing video received from the camera 116, or the sensing electronics 138d of the detachable speaker units 132 (e.g., if the detachable speaker units 132 are powered independent of being coupled to the head-mounted display unit 110), such as by detecting movement toward the head-mounted display unit 110 and or change in proximity therebetween.

In a second operation 1020, while the audio output device is in the field of view of the head-mounted display unit, a visual indicator 1060 is displayed in spatial proximity to the audio output device. For example, the controller 150 may send display signals to the head-mounted display unit 110 for displaying the visual indicator 1060 with the display screen 114 according to the position determined in the first operation 1010. The visual indicator 1060 may, as described above, visually communicate to the user an audio characteristic of the audio output device (e.g., showing an icon or animation resembling sound waves or type of audio device, such as headphones) and/or instructions for using the audio output device (e.g., for coupling the detachable speaker unit 132 to the head-mounted display unit 110). The field of view of the head-mounted display unit 110 is that portion of the real environment which is viewable by the user at a given time.

In a third operation 1030, when the audio output device is outside the field of view of the display screen 114, the visual indicator 1070 is displayed to illustrate the physical proximity of the audio output device to the head-mounted display unit (e.g., of the detachable speaker unit 132 to the coupling location). For example, the controller 150 may send display signals to the head-mounted display unit 110 for displaying the visual indicator 1070 with the display screen 114 according to the position determined in the first operation 1010. As discussed above, the visual indicator 1070 may include the illustration 1070a representing the detachable speaker unit 132, and the illustration 1070b representing the coupling location in spatial relationship thereto representing the physical spatial relationship (e.g., the physical proximity) of the detachable speaker unit 132 to the coupling location on the head-mounted display unit 110. It should be noted that one, the other, or both of the second operation 1020 and the third operation 1030 may be performed.

In a fourth operation 1040, which may occur simultaneous to the second operation 1020 (i.e., when the audio output device is within the field of view) and/or the third operation 1030 (i.e., when the audio output device is outside the field of view), the virtual aural content may be output by the HMD speakers 118, which may spatially simulate sound being emitted from the audio output device (e.g., being spatially balanced left-to-right and/or changing in volume to represent the left-right orientation and/or distance, respectively, of the audio output device). The virtual aural content may correspond to the visual indicator 1060 or the visual indicator 1070, for example, coinciding in time with display thereof.

While the method 1000 is discussed as providing both of the visual indicators 1060, 1070, the method 1000 may instead include operations for providing only one of the visual indicators 1060, 1070.

As referenced above, the method 1000 may be used with an audio output device other than the audio headset 130 or the detachable speaker units 132, which is associated with the display system 100. For example, another audio output device may be an external speaker that is not physically coupleable to the head-mounted display unit.

Furthermore, the method 1000 may be used in conjunction with the methods 500, 600, 700 discussed above. For example, the visual indicators 1060, 1070 may be displayed simultaneous with the sound output from the HMD speakers 118 and/or the detachable speaker units 132 as described with the methods 500, 600, 700, 800, 900.

Figure 11:
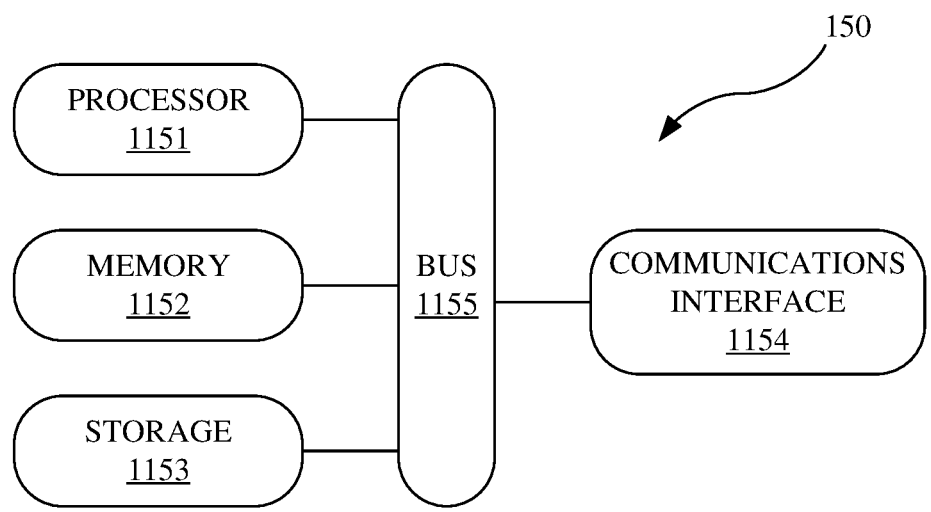
FIG. 11 is a schematic view of a hardware configuration for a controller of the display system of FIG. 1A.

Referring to FIG. 11, the controller 150 may have the hardware configuration as shown and described, or other suitable configuration. The controller 150 may include a processor 1151, memory 1152, storage 1153, a communications interface 1154, and a bus 1155 connecting such components or devices for communication therebetween. The processor 1151 is operable to execute computer program instructions and perform operations described by such instructions. As an example, the processor 1151 may be a central processing unit or o other conventional processing device. The memory 1152 may be a volatile, high-speed, short-term information storage device (e.g., random-access memory module). The storage 1153 may be a non-volatile information storage device (e.g., a hard drive). The communications interface 1154 is configured to send and/or receive signals (e.g., wired or wirelessly), such as to and/or from the head-mounted display unit 110 and/or the audio headset 130.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mounted system may have one or more speaker(s) and an integrated opaque display. Alternatively, a head mounted system may be configured to accept an external opaque display (e.g., a smartphone). The head mounted system may incorporate one or more imaging sensors to capture images or video of the physical environment, and/or one or more microphones to capture audio of the physical environment. Rather than an opaque display, a head mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

As described above, one aspect of the present technology is the gathering and use of data available from various sources to display visual content and output audio content, which may include varying content based on movement or conditions of the head or eyes of the user. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to output content. Accordingly, use of such personal information data enables users an enhanced user experience. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of observing conditions or movements of the head or eyes of the user, the present technology can be configured to allow users to select to "opt in" or "opt out" of participation in the collection of personal information data during registration for services or anytime thereafter. In another example, users can select not to provide user movement or condition data or can select to limit the length of time user observation data is observed or maintained. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be provided to users by inferring preferences based on non-personal information data or a bare minimum amount of personal information, such as the content being requested by the device associated with a user, or publicly available information.

What is claimed is:

1. A display system comprising:
    a head-mounted display unit that outputs visual content to a user;
    an audio output device that outputs aural content to the user; and
    a controller that controls the head-mounted display unit to output the visual content and the audio output device to output the aural content;
    wherein the visual content output by the head-mounted display unit includes a visual indicator in spatial proximity to the audio output device.

2. The display system according to claim 1, wherein the visual indicator indicates a sound output capability of the audio output device to the user;
    wherein a position of the audio output device is determined by the controller according to sensors of one or more of the head-mounted display unit or the audio output device; and
    wherein the audio output device is a detachable speaker unit that is detachably coupleable to the head-mounted display unit.

3. The display system according to claim 1, wherein the visual indicator indicates a sound output capability of the audio output device to the user.

4. The display system according to claim 3, wherein the visual indicator includes one or more of surrounds or overlays the audio output device in a field of view of the head-mounted display unit.

5. The display system according to claim 3, wherein the visual indicator includes a depicting of one or more of sound waves or an audio headset.

6. The display system according to claim 3, wherein the visual indicator is animated.

7. The display system according to claim 6, wherein the visual indicator is animated by changing appearance according to sound of the aural content output by the audio output device.

8. The display system according to claim 7, wherein the visual indicator increases in size according to the sound.

9. The display system according to claim 7, wherein the visual indicator visually pulsates according to a beat of the sound.

10. The display system according to claim 1, wherein a position of the audio output device is determined by the controller according to one or more sensors of one or more of the head-mounted display unit or the audio output device.

11. The display system according to claim 1, wherein when the audio output device is in a field of view of the head-mounted display unit, the field of view is a portion of a real environment that is viewable by the user by one of a video pass-through or an optical pass-through.

12. The display system according to claim 1, wherein the audio output device is a detachable speaker unit that is detachably coupleable to the head-mounted display unit.

13. A display system comprising:
    a head-mounted display unit that outputs visual content to a user;
    an audio output device that outputs aural content to the user and is detachably coupleable to the head-mounted display unit; and
    a controller that controls the head-mounted display unit to output the visual content and the audio output device to output the aural content;
    wherein the controller controls the head-mounted display unit to output visual content to indicate a position of the audio output device relative to the head-mounted display unit.

14. The display system according to claim 13, further comprising an audio headset that includes the audio output device and another audio output device that is detachably coupleable to the head-mounted display unit;
    wherein the visual content includes graphical representations of the audio output device;
    wherein the visual content includes instructions to move the audio output device to the head-mounted display unit, the instructions including one or more of iconography, text, or an animation; and
    wherein the controller determines the position of the audio output device relative to the head-mounted display unit according to sensors of one or more of the head-mounted display unit or the audio output device.

15. The display system according to claim 13, wherein the visual content includes graphical representations of the audio output device and a coupling location of the audio output device.

16. The display system according to claim 15, wherein the graphical representations of the audio output device and the coupling location are depicted in spatial relationship to each other according to the position of the audio output device relative to the head-mounted display unit.

17. The display system according to claim 13, wherein the visual content includes instructions to move the audio output device to the head-mounted display unit, the instructions including one or more of iconography, text, or an animation.

18. The display system according to claim 13, further comprising an audio headset that includes the audio output device and another output device that is detachably coupleable to the head-mounted display unit.

19. The display system according to claim 18, wherein the controller determines the position of the other audio output device relative to the head-mounted display unit according to sensors of one or more of the head-mounted display unit or the audio output device.

20. A method for providing visual content with a display system having a head-mounted display unit that outputs the visual content to a user, an audio output device that outputs aural content to the user, and a controller that controls the head-mounted display unit to output the visual content and the audio output device to output the aural content, the method comprising:
- determining, with the controller and one or more sensors of one or more of the head-mounted display unit or the audio output device, a position of the audio output device relative to the head-mounted display unit; and
- displaying, with the head-mounted display unit according to the position, a visual indicator in spatial proximity to the audio output device.

* * * * *